(12) United States Patent
Ebisawa et al.

(10) Patent No.: US 9,947,834 B2
(45) Date of Patent: Apr. 17, 2018

(54) LIGHT EMITTING ELEMENT AND LIGHT EMITTING ELEMENT PACKAGE

(71) Applicant: ROHM CO., LTD., Kyoto (JP)

(72) Inventors: Tomoya Ebisawa, Kyoto (JP); Tomohito Kawase, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/149,326

(22) Filed: Jan. 7, 2014

(65) Prior Publication Data
US 2014/0191268 A1 Jul. 10, 2014

(30) Foreign Application Priority Data

Jan. 8, 2013 (JP) ................. 2013-001136
Dec. 18, 2013 (JP) ................. 2013-261574

(51) Int. Cl.
| | |
|---|---|
| *H01L 33/36* | (2010.01) |
| *H01L 33/42* | (2010.01) |
| *H01L 33/20* | (2010.01) |
| *H01L 33/38* | (2010.01) |
| *H01L 33/40* | (2010.01) |
| *H01L 33/12* | (2010.01) |

(52) U.S. Cl.
CPC .............. *H01L 33/42* (2013.01); *H01L 33/12* (2013.01); *H01L 33/20* (2013.01); *H01L 33/382* (2013.01); *H01L 33/405* (2013.01); *H01L 2224/14* (2013.01); *H01L 2224/48091* (2013.01); *H01L 2224/73265* (2013.01)

(58) Field of Classification Search
CPC ........ H01L 33/36; H01L 33/38; H01L 33/382; H01L 33/387
See application file for complete search history.

(56) References Cited

U.S. PATENT DOCUMENTS

| | | | |
|---|---|---|---|
| 2006/0231852 A1* | 10/2006 | Kususe et al. .............. | 257/99 |
| 2011/0233388 A1* | 9/2011 | Nakamura .............. | G01J 3/02 |
| | | | 250/226 |
| 2012/0043571 A1* | 2/2012 | Chu .................. | H01L 33/405 |
| | | | 257/98 |
| 2012/0049236 A1* | 3/2012 | Kamiya .............. | H01L 33/20 |
| | | | 257/99 |

(Continued)

FOREIGN PATENT DOCUMENTS

| | | |
|---|---|---|
| JP | 2008-108905 A | 5/2008 |
| JP | 2008-263130 A | 10/2008 |
| JP | 2010-087283 A | 4/2010 |

*Primary Examiner* — Jae Lee
(74) *Attorney, Agent, or Firm* — Rabin & Berdo, P.C.

(57) ABSTRACT

A light emitting element includes: a substrate; a first conductive type semiconductor layer stacked on the substrate; a light emitting layer stacked on the first conductive type semiconductor layer; a second conductive type semiconductor layer stacked on the light emitting layer; an ITO layer stacked on the second conductive type semiconductor layer; and a reflective layer stacked on the ITO layer. The substrate is transparent to an emission wavelength of the light emitting layer, and the reflective layer includes a Ti-containing first layer stacked on the ITO layer to make contact with the ITO layer and an Al-containing second layer stacked on the first layer in an opposite side to the ITO layer.

24 Claims, 19 Drawing Sheets

(56) References Cited

U.S. PATENT DOCUMENTS

| | | | | |
|---|---|---|---|---|
| 2012/0074441 A1* | 3/2012 | Seo | ................ | H01L 27/153 |
| | | | | 257/91 |
| 2013/0168691 A1* | 7/2013 | Sakai | ............................ | 257/76 |
| 2013/0187122 A1* | 7/2013 | Lee et al. | ........................ | 257/9 |
| 2013/0285092 A1* | 10/2013 | Wei | ....................... | H01L 33/46 |
| | | | | 257/98 |
| 2014/0146563 A1* | 5/2014 | Watanabe et al. | ............ | 362/606 |

\* cited by examiner

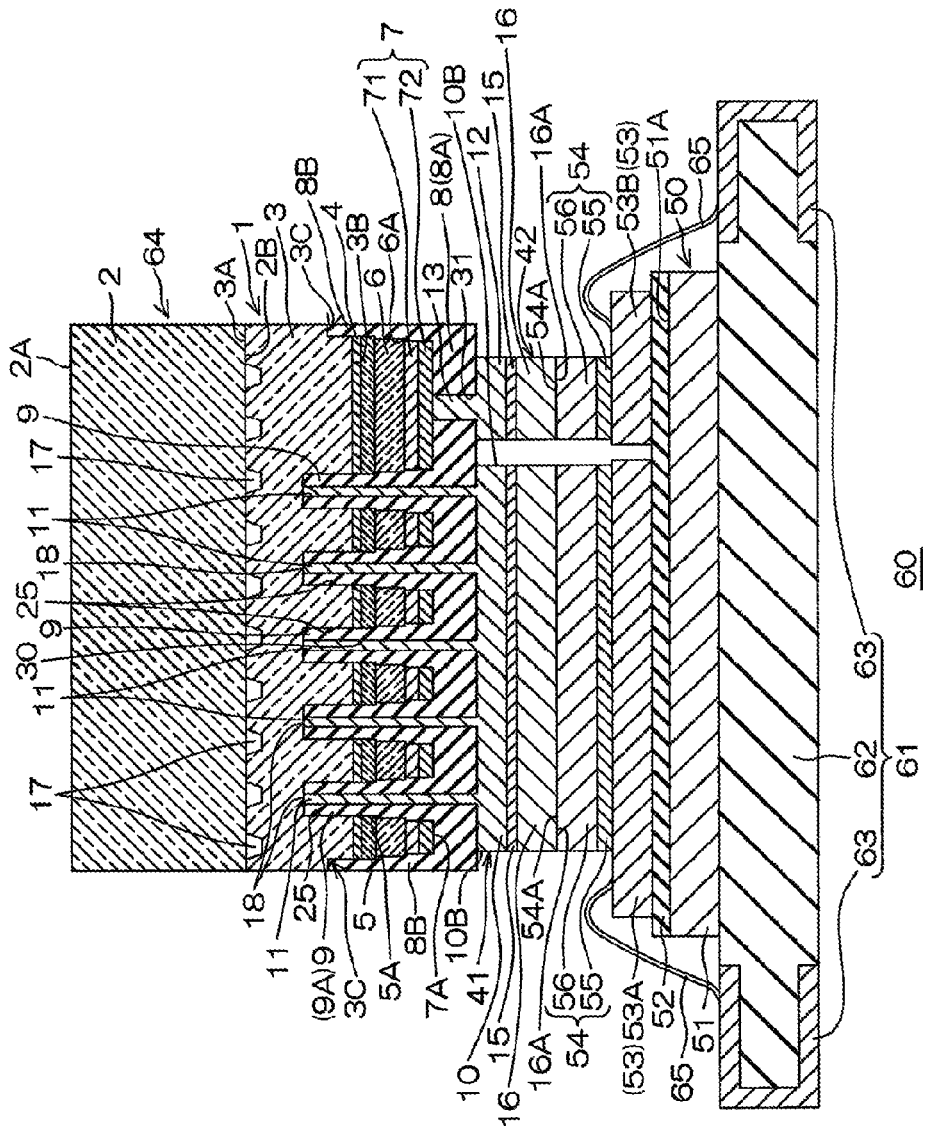

LIGHT EMITTING ELEMENT AND LIGHT EMITTING ELEMENT PACKAGE

CROSS-REFERENCE TO RELATED APPLICATIONS

This application is based upon and claims the benefit of priority from Japanese Patent Application Nos. 2013-001136, filed on Jan. 8, 2013, and 2013-261574, filed on Dec. 18, 2013, the entire contents of which are incorporated herein by reference.

TECHNICAL FIELD

The present disclosure relates to a light emitting element and a light emitting element package having the light emitting element covered with a package.

BACKGROUND

A semiconductor light emitting element includes a sapphire substrate from which light is extracted, an n-GaN layer, a light emitting layer, a p-GaN layer, a transparent electrode, an insulating layer, a barrier layer and an AuSn layer sequentially stacked in this order on the sapphire substrate. The AuSn layer is bonded to a wiring board. The transparent electrode and the barrier layer are directly connected by a p-type electrode disposed in the lateral side of the insulating layer. A metal reflective layer made of Al is embedded in the insulating layer. The insulating layer (the insulating layer in the side of the transparent layer) is sandwiched between the metal reflective layer and the transparent layer made of ITO.

When the light emitting layer emits light, most of the light is extracted from the sapphire substrate, while some light propagates to the transparent electrode rather than the sapphire substrate. After transmitting through the transparent layer, the light propagating to the transparent electrode is reflected at an interface between the metal reflective layer and the insulating layer, and is extracted from the sapphire substrate via the transparent electrode.

SUMMARY

The present disclosure provides some embodiments of a light emitting element which is capable of preventing corrosion of an ITO layer and increasing a reflectance in a reflective layer.

According to one embodiment of the present disclosure, there is provided a light emitting element including: a substrate; a first conductive type semiconductor layer stacked on the substrate; a light emitting layer stacked on the first conductive type semiconductor layer; a second conductive type semiconductor layer stacked on the light emitting layer; an ITO layer stacked on the second conductive type semiconductor layer; and a reflective layer stacked on the ITO layer, wherein the substrate is transparent to an emission wavelength of the light emitting layer, and the reflective layer includes a Ti-containing first layer stacked on the ITO layer to make contact with the ITO layer and an Al-containing second layer stacked on the first layer in an opposite side to the ITO layer. According to another embodiment of the present disclosure, there is provided a light emitting element including: a substrate; a first conductive type semiconductor layer stacked on the substrate; a light emitting layer stacked on the first conductive type semiconductor layer; a second conductive type semiconductor layer stacked on the light emitting layer; an ITO layer stacked on the substrate in the opposite side to the first conductive type semiconductor layer; and a reflective layer stacked on the ITO layer in the opposite side to the substrate, wherein the substrate is transparent to an emission wavelength of the light emitting layer, and the reflective layer includes a Ti-containing first layer stacked on the ITO layer to make contact with the ITO layer and an Al-containing second layer stacked on the first layer in an opposite side to the ITO layer.

With this configuration, light from the light emitting layer can be instantly released from a light extraction surface of the substrate or may be released from the light extraction surface of the substrate after once transmitting through the ITO layer and being reflected by the reflective layer. In the reflective layer stacked on the ITO layer, the Ti-containing first layer is interposed between the ITO layer and the Al-containing second layer. Accordingly, a contact between the second layer and the ITO layer can be avoided, thereby preventing galvanic corrosion of the ITO layer. Thus, the Ti-containing first layer can protect the ITO layer without affecting the reflectance of the second layer, which can result in an increase in the reflectance of the reflective layer as compared to the case where the first layer is not formed.

That is, it is possible to increase the reflectance of the reflective layer while preventing the corrosion of the ITO layer. The first layer may have a thickness of equal to or more than 1 nm and equal to or less than 10 nm, thereby providing an increased reflectance of the reflective layer. In particular, the first layer may have a thickness of equal to or less than 5 nm, a thickness of equal to or less than 2 nm or a thickness of equal to or more than 1 nm.

The first layer may be made of TiN. Only the first layer may be present between the second layer and the ITO layer, thereby providing an increased reflectance of the reflective layer as compared to the case where one or more different layers are present therebetween in addition to the first layer. The substrate may be made of sapphire.

The light emitting element may further include an insulating layer covering the ITO layer and the reflective layer and electrically isolating the first conductive type semiconductor layer from the second conductive type semiconductor layer. The insulating layer may include a multi-layered reflecting mirror including two or more kinds of films having different refractive indexes. With this configuration, light escaping from a region not covered by the reflective layer can be reflected by the multi-layered reflecting mirror toward the light extraction surface of the substrate. Accordingly, the multi-layered reflecting mirror can prevent the light from being leaked to the opposite side to the light extraction surface, which can result in improved brightness of the light emitting element.

According to another embodiment of the present disclosure, there is provided a light emitting element package including: the above-described light emitting element; and a package covering the light emitting element in such a manner to expose a light extraction surface of the substrate.

BRIEF DESCRIPTION OF THE DRAWINGS

FIG. 12A is a sectional view schematically illustrating a structure of the light emitting element.

DETAILED DESCRIPTION

Figure 1:
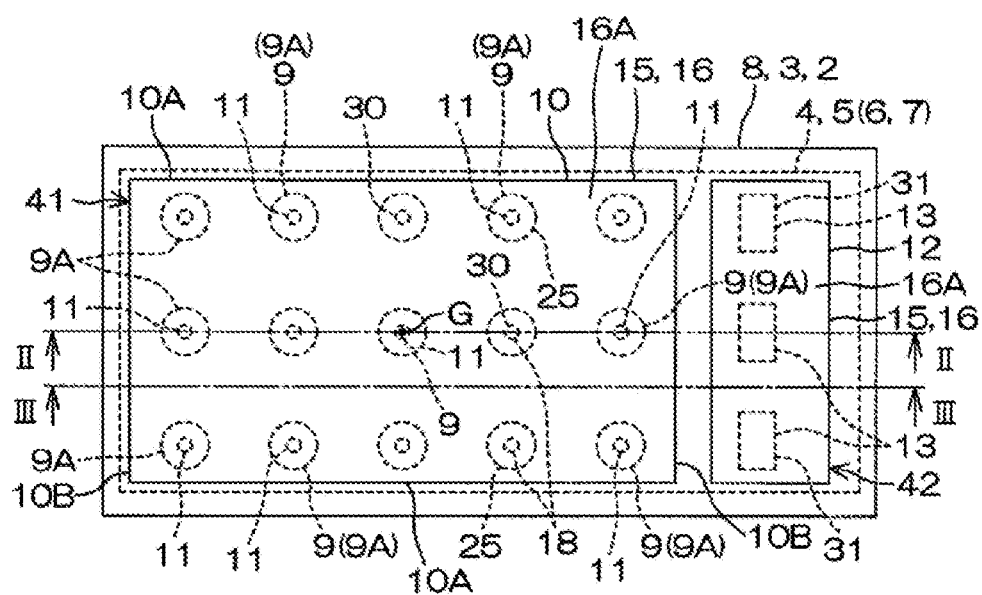
FIG. 1 is a schematic plane view of a light emitting element according to an embodiment of the present disclosure.
Figure 2:
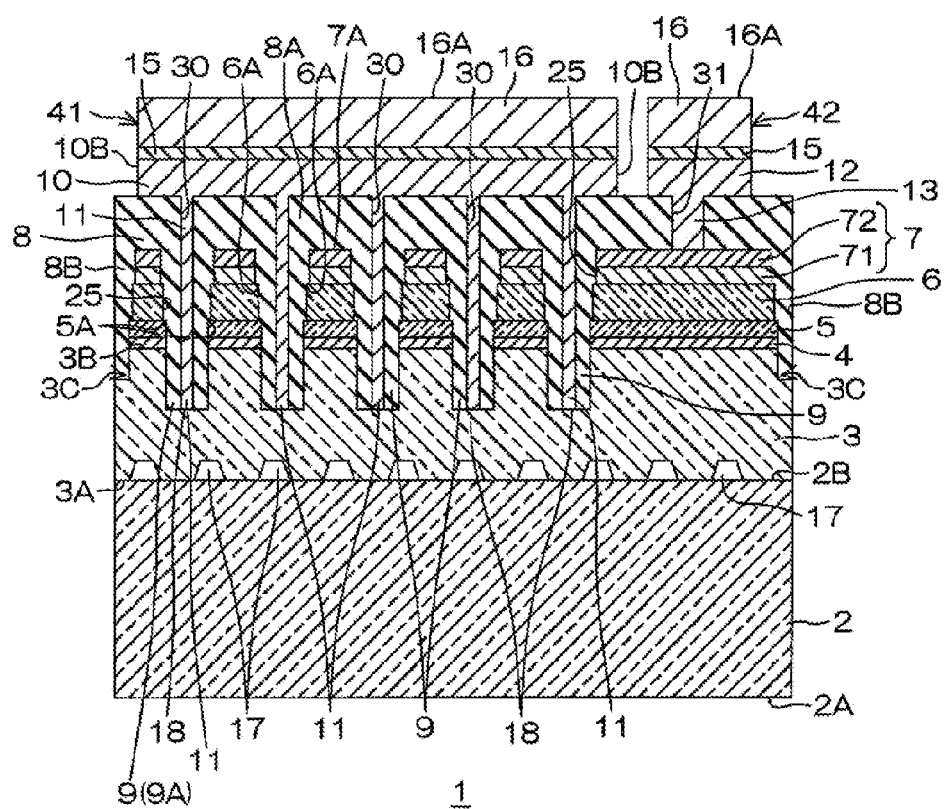
FIG. 2 is a sectional view taken along section line II-II in FIG. 1.
Figure 3:
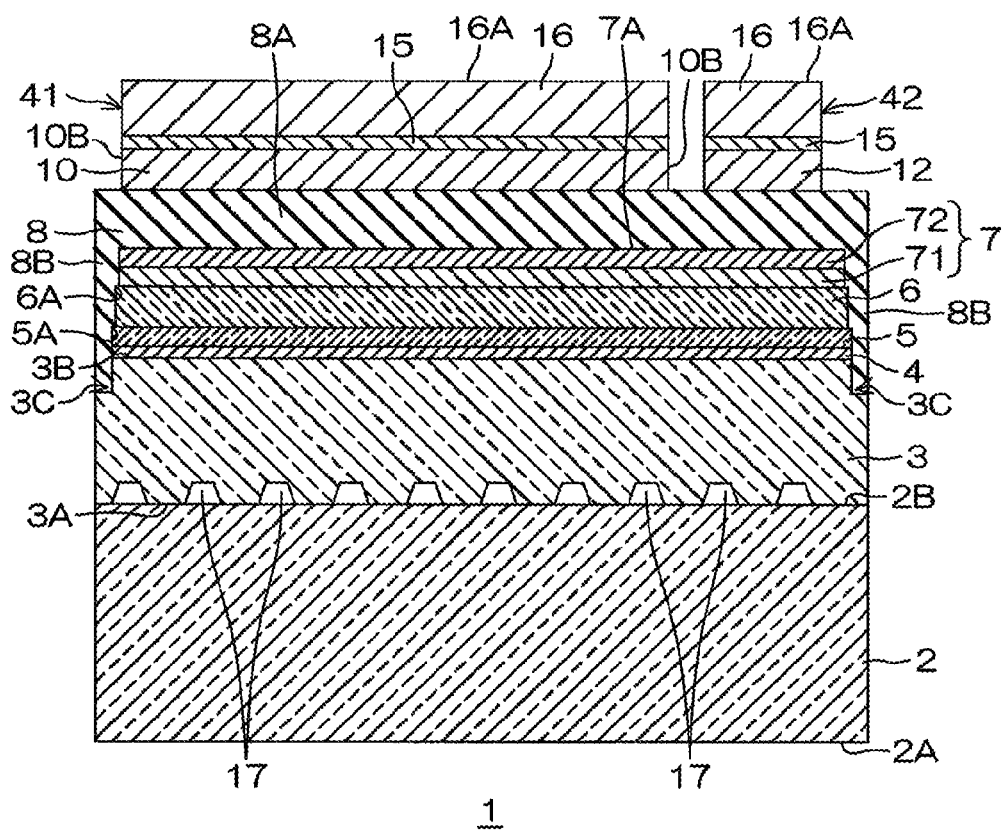
FIG. 3 is a sectional view taken along section line III-III in FIG. 1.
Figure 4:
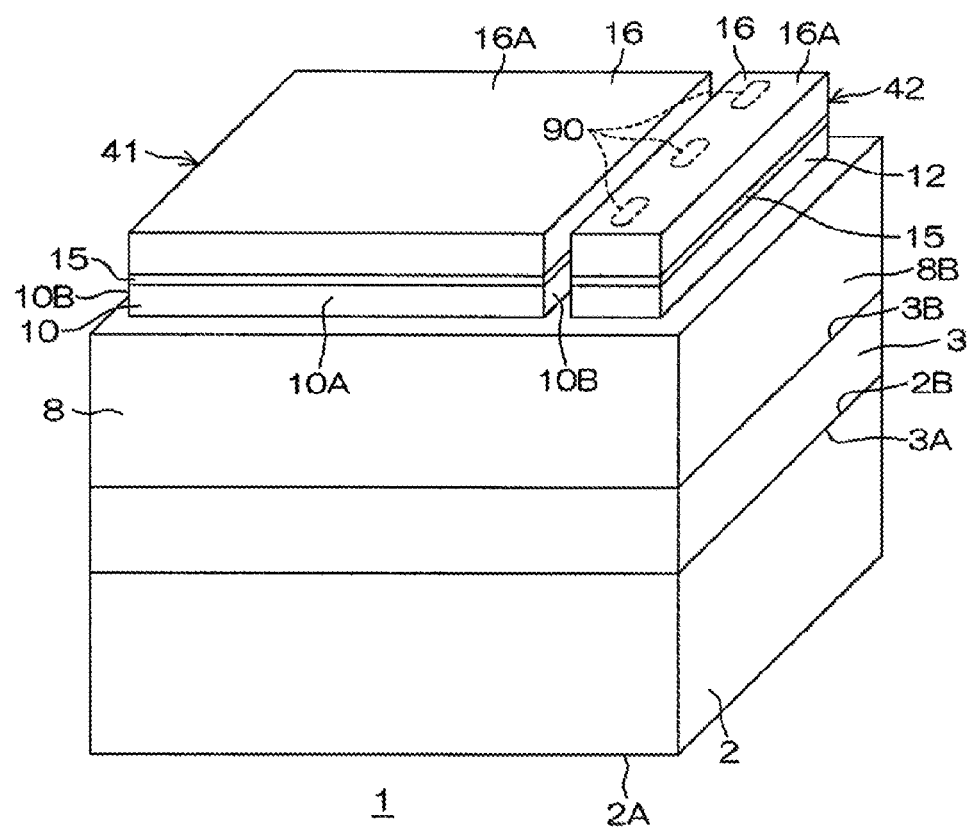
FIG. 4 is a structural perspective view of the light emitting element.

Some embodiments of the present disclosure will now be described in detail with reference to the drawings. Throughout the drawings, the same or similar elements, members and processes are denoted by the same reference numerals and explanation of which will not be repeated. The disclosed embodiments are provided for the purpose of illustration, not limitation, of the present disclosure and all features and combinations thereof described in the embodiments cannot be necessarily construed to describe the spirit of the present disclosure. FIG. 1 is a schematic plane view of a light emitting element according to an embodiment of the present disclosure. FIG. 2 is a sectional view taken along section line II-II in FIG. 1. FIG. 3 is a sectional view taken along section line III-III in FIG. 1. FIG. 4 is a structural perspective view of the light emitting element.

Referring to FIG. 2, a light emitting element 1 includes a substrate 2, a first conductive type semiconductor layer 3, a light emitting layer 4, a second conductive type semiconductor layer 5, an ITO (Indium Tin Oxide) layer 6, a reflective layer 7, an insulating layer 8, an insulating tube layer 9, a first external connection 10, a first contact 11, a second external connection 12, a second contact 13, a barrier layer 15, and a bonding layer 16.

On the substrate 2 are sequentially stacked the first conductive type semiconductor layer 3, the light emitting layer 4, the second conductive type semiconductor layer 5, the ITO layer 6, the reflective layer 7 and the insulating layer 8 in this order. The substrate 2 is made of a material (for example, sapphire, GaN or SiC) transparent to an emission wavelength (for example, 450 nm) of the light emitting layer 4 and has a predetermined thickness. As used herein, the phase "transparent to an emission wavelength" refers to, for example, a transmittance of an emission wavelength of 60% or more. The substrate 2 is formed in a rectangular shape having a longitudinal direction in the horizontal direction in FIG. 2 and a lateral direction in the depth direction in FIG. 2 when viewed in the thickness direction from the top (see FIG. 1). The dimension of the substrate 2 in the longitudinal direction is, for example, about 1,000 μm and the dimension thereof in the lateral direction is, for example, about 500 μm. In FIG. 2, a lower surface of the substrate 2 corresponds to a front surface 2A serving as a light extraction surface and an upper surface thereof corresponds to a rear surface 2B in the opposite side to the front surface 2A. The rear surface 2B of the substrate 2 is bonded to the first conductive type semiconductor layer 3. The rear surface 2B of the substrate 2 is formed with a plurality of convex portions 17 which project toward the first conductive type semiconductor layer 3 and are discretely arranged. Specifically, the convex portions 17 may be arranged at specified intervals in the rear surface 2B of the substrate 2 in a matrix form or a staggered form. Each of the convex portions 17 may be made of SiN.

The first conductive type semiconductor layer 3 is stacked on the substrate 2. The first conductive type semiconductor layer 3 covers the rear surface 2B of the substrate 2 entirely. The first conductive type semiconductor layer 3 is made of an n-type nitride semiconductor (for example, GaN) and is transparent to an emission wavelength of the light emitting layer 4. In the first conductive type semiconductor layer 3, a lower surface covering the rear surface 2B of the substrate 2 in FIG. 2 is referred to as a front surface 3A, and an upper surface in the opposite side to the front surface 3A is referred to as a rear surface 3B. When viewed in the thickness direction of the substrate 2 (also the thickness direction of the first conductive type semiconductor layer 3) from the top, an edge of the rear surface 3B of the first conductive type semiconductor layer 3 is formed with a stepped portion 3C recessed toward the front surface 3A.

The light emitting layer 4 is stacked on the first conductive type semiconductor layer 3. The light emitting layer 4 covers the entire rear surface 3B of the first conductive type semiconductor layer 3 except the recessed stepped portion 3C. In this embodiment, the light emitting layer 4 is made of an In-containing nitride semiconductor (for example, InGaN) and has a thickness of, for example, about 100 nm. The emission wavelength of the light emitting layer 4 may be 400 nm or higher, more specifically, 430 nm to 530 nm. In this embodiment, the emission wavelength of the light emitting layer 4 may be, for example, 440 nm to 460 nm.

The second conductive type semiconductor layer 5 is stacked on the light emitting layer 4 in the same pattern as the light emitting layer 4. Accordingly, when viewed from the top, a region of the second conductive type semiconductor layer 5 is overlapped with a region of the light emitting layer 4. The second conductive type semiconductor layer 5 is made of a p-type nitride semiconductor (for example, GaN) and is transparent to the emission wavelength of the light emitting layer 4. In this manner, a basic structure of the light emitting diode is formed, which includes the first conductive type semiconductor layer 3 serving as an n-type semiconductor layer, the second conductive type semiconductor layer 5 serving as a p-type semiconductor layer, and the light emitting layer 4 interposed therebetween. A thickness of the second conductive type semiconductor layer 5 is, for example, about 200 nm. In this case, the total thickness of the first conductive type semiconductor layer 3, the light emitting layer 4 and the second conductive type semiconductor layer 5 is, for example, about 4.5 μm.

The ITO layer 6 is stacked on the second conductive type semiconductor layer 5 in substantially the same pattern as the second conductive type semiconductor layer 5. As the second conductive type semiconductor layer 5 and the underlying first conductive type semiconductor layer 3 and light emitting layer 4 are disposed on the rear surface 2B of the substrate 2, the ITO layer 6 is also disposed on the rear surface 2B of the substrate 2, facing the substrate 2 in its thickness direction. The ITO layer 6 is made of Indium Tin Oxide (ITO) and is transparent to the emission wavelength of the light emitting layer 4. When viewed from the top, the ITO layer 6 is located between an outer contour (outline) and an inner contour of the second conductive type semiconductor layer 5 (i.e., inside the region of the second conductive type semiconductor layer 5). Accordingly, when viewed from the top, the second conductive type semiconductor layer 5 has a stepped portion 5A projecting beyond an outline of the ITO layer 6. The ITO layer 6 is in ohmic contact with the second conductive type semiconductor layer 5 and has a function of bonding the reflective layer 7 to the second conductive type semiconductor layer 5.

The reflective layer 7 is stacked on the ITO layer 6 in substantially the same pattern as the ITO layer 6. That is, the reflective layer 7 is stacked on the ITO layer 6 in the opposite side to the substrate 2. The reflective layer 7 can make ohmic contact with the second conductive type semiconductor layer 5 via the ITO layer 6. The ITO layer 7 includes a first layer 71 stacked on the ITO layer 6 in contact with the ITO layer 6, and a second layer 72 stacked on the first layer 71.

Figure 5:
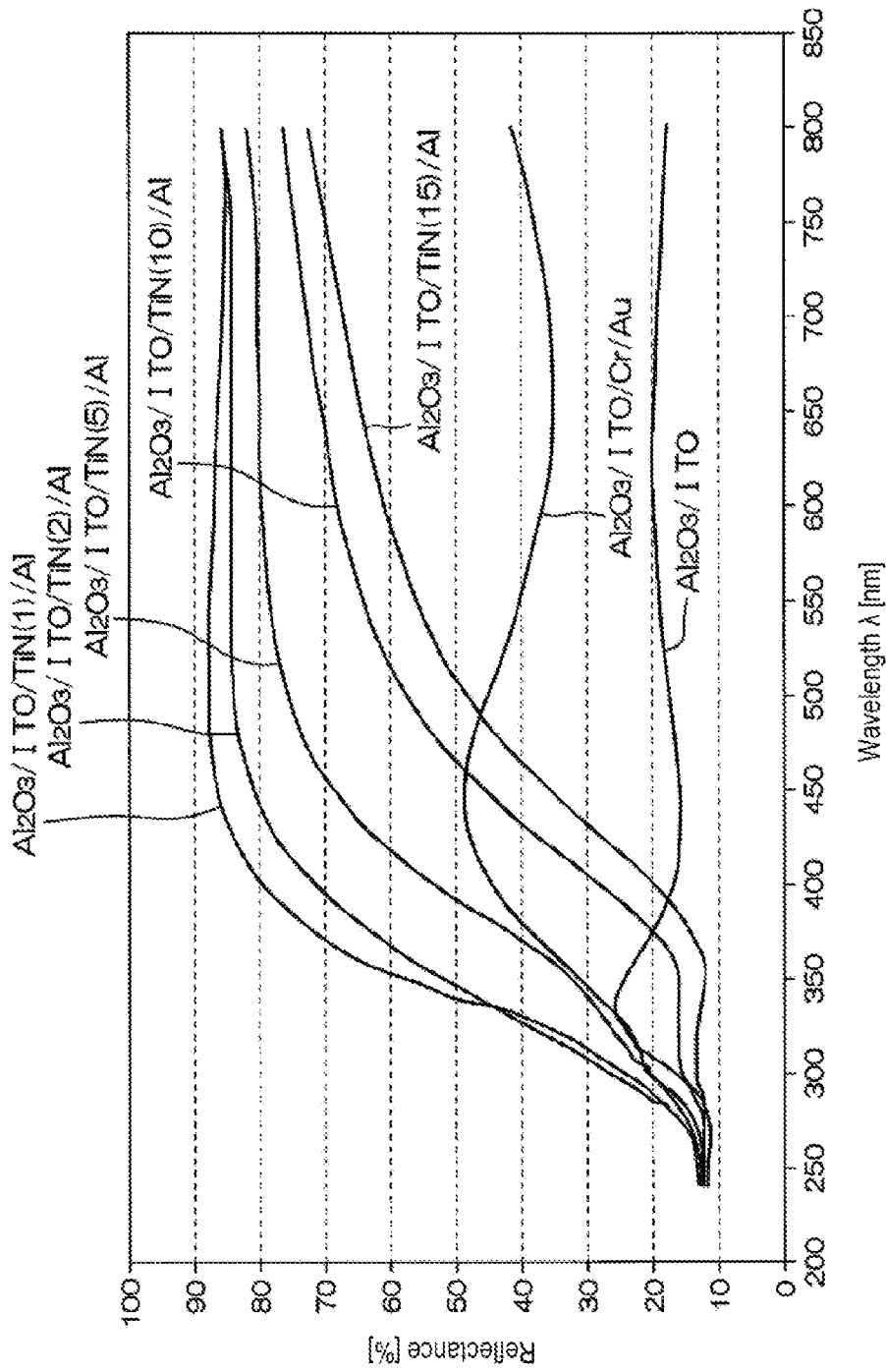
FIG. 5 is a graph showing a relationship between a wavelength and a reflectance in a case where a thickness of a first layer of a reflective layer is changed.
Figure 6:
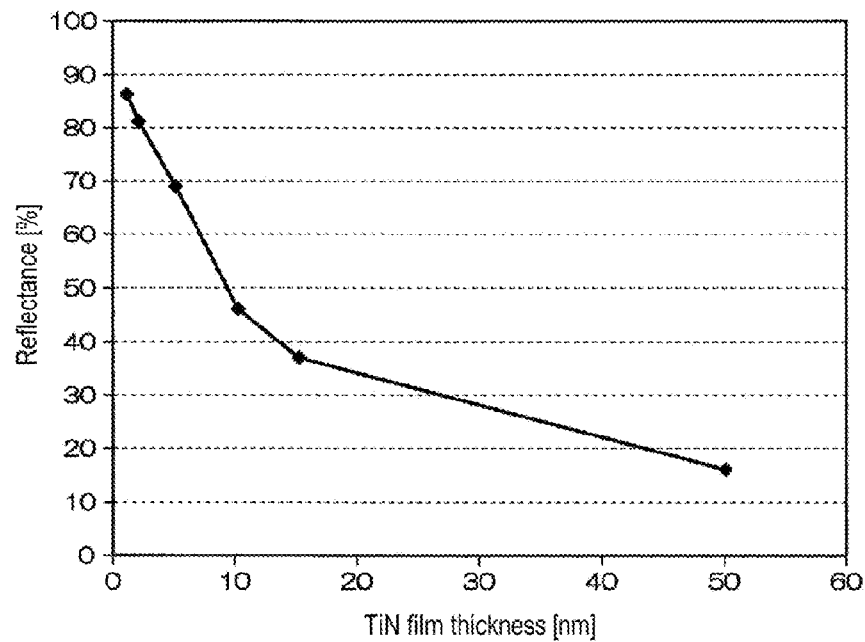
FIG. 6 is a graph showing a relationship between the thickness of the first layer of the reflective layer and its reflectance.
Figure 7:
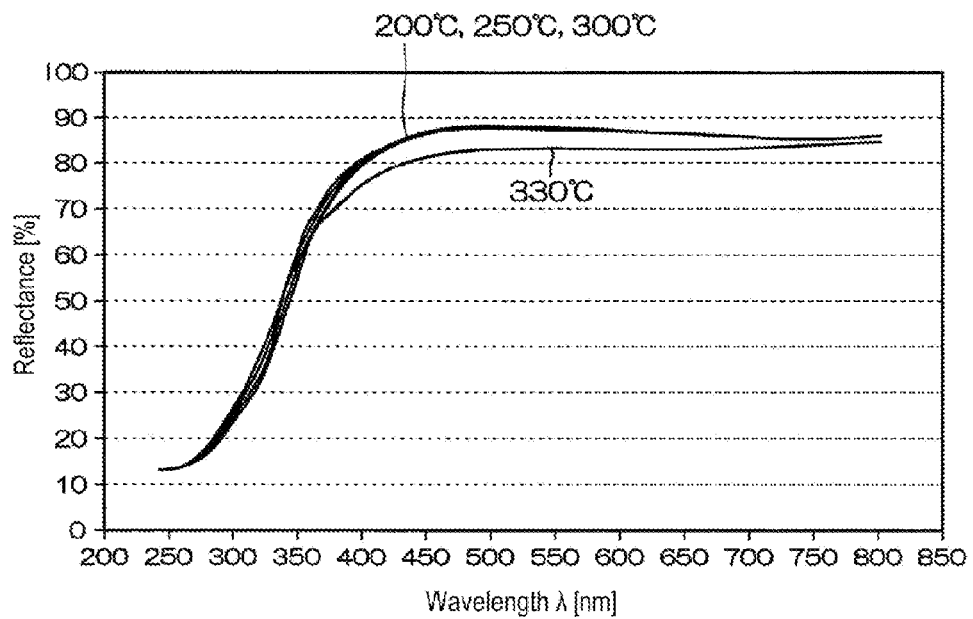
FIG. 7 is a graph showing a relationship between a wavelength and a reflectance in a case where the first layer of the reflective layer is made of TiN having a thickness of 1 nm.
Figure 8:
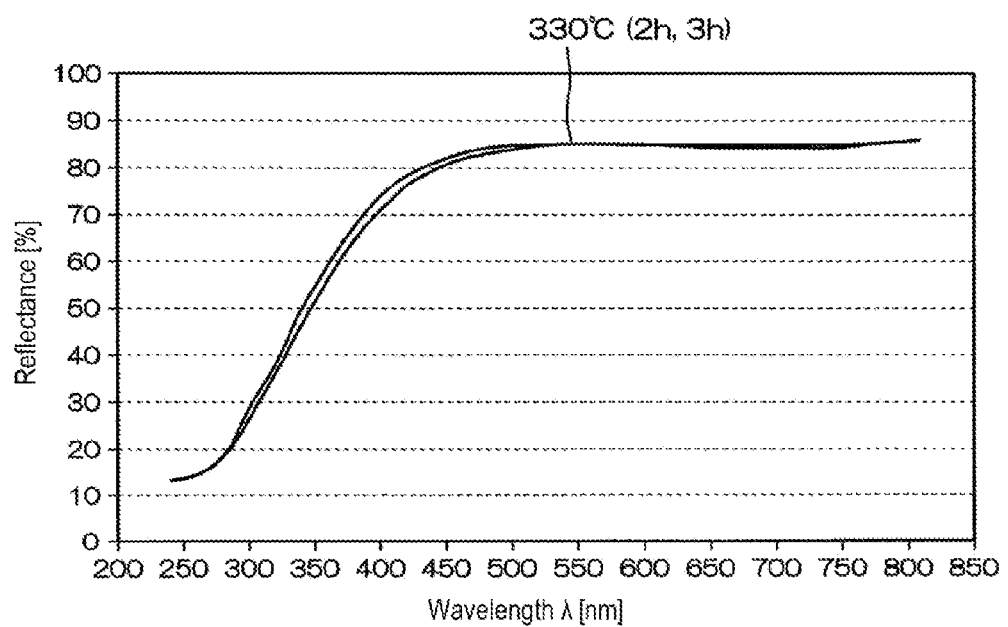
FIG. 8 is a graph showing a relationship between a wavelength and a reflectance in a case where the first layer of the reflective layer is made of TiN having a thickness of 2 nm.

The first layer 71 is made of a Ti-containing material (for example, TiN). The first layer 71 may be made solely of Ti. Next, the optimal thickness of the first layer 71 will be described with reference to graphs of FIGS. 5 to 8. FIG. 5 is a graph showing a relationship between a wavelength and a reflectance in a case where a thickness of the first layer 71 is changed. FIG. 6 is a graph showing a relationship between the thickness of the first layer 71 and its reflectance. FIG. 7 is a graph showing a relationship between a wavelength and a reflectance in a case where the first layer 71 is made of TiN having a thickness of 1 nm. FIG. 8 is a graph showing a relationship between a wavelength and a reflectance in a case where the first layer 71 is made of TiN having a thickness of 2 nm.

First, a plurality of kinds of samples were prepared by sequentially stacking the ITO layer 6, the first layer 71 and the second layer 72 in this order on an $Al_2O_3$ layer subjected to double-side polishing. The first layer 71 is made of TiN and the second layer 72 is made of Al. The samples have the same configuration for the $Al_2O_3$ layer, the ITO layer 6 (100 nm in thickness) and the second layer 72 (1000 nm in thickness) while the thickness of the first layer 71 is varied to 1 nm, 2nm, 5 nm, 10 nm and 15 nm. FIG. 5 shows a relationship between a wavelength and a reflectance of each sample when different samples are irradiated with different wavelengths. Lead lines attached to characteristic curves of the samples indicate descriptions on compositions of the samples ($Al_2O_3$/ITO/TiN (1, 2, 5, 10 and 15)/Al) and numbers in brackets in the descriptions represent the thicknesses (1 nm, 2 nm, 5 nm, 10 nm and 15 nm) of the first layer 71. For the purpose of comparing these samples, FIG. 5 also shows a characteristic curve of a conventional sample (lead line description : $Al_2O_3$/ITO/Cr/Au) formed by sequentially stacking an ITO layer 6 (100 nm in thickness), a Cr layer (30 nm in thickness) and an Au layer (2000 nm in thickness) on an $Al_2O_3$ layer in this order and a characteristic curve of a sample (lead line description: $Al_2O_3$/ITO) formed by stacking an ITO layer 6 on an $Al_2O_3$ layer. It can be seen from FIG. 5 that the existence of the first layer 71 (made of TiN) between the ITO layer 6 and the second layer 72 (made of Al) can provide a high reflectance over a wide range of wavelength.

A graph of FIG. 6 shows a relationship between a reflectance at the wavelength of 450 nm in FIG. 5 and a thickness of the first layer 71 (TiN film thickness). For reference, FIG. 6 also shows a reflectance for TiN film thickness of 50 nm. As can be seen from FIG. 6, in order to obtain a high reflectance (higher than that of the conventional sample), the thickness of the first layer 71 may be 10 nm or less, more specifically, 5 nm or less.

As can be seen from FIG. 5, when the emission wavelength is particularly equal to or more than 400 nm and equal to or less than 450 nm, the thickness of the first layer 71 may be 2 nm or less. When the emission wavelength is 450 nm or more, the thickness of the first layer 71 may be 5 nm or less. Next, four new different samples were prepared by subjecting the sample having the first layer 71 having the thickness of 1 nm to heating treatment at different heating temperatures (200 degrees C., 250 degrees C., 300 degrees C. and 330 degrees C.) for three hours. FIG. 7 shows a relationship between a wavelength and a reflectance of each sample when the four prepared samples and the basic sample subjected to no heating treatment are irradiated with light having different wavelengths. It was found that the samples having the first layer 71 having the thickness of 1 nm and subjected to the heating treatment at the heating temperature of 200 degrees C. to 300 degrees C. showed substantially the same characteristic curve as the basic sample, whereas the reflectance decreased when the heating temperature was increased to 330 degrees C. For a (thin) sample having the first layer 71 having the thickness of 1 nm, it appears that the reflectance decreased due to an effect of galvanic corrosion when the heating temperature is increased to 330 degrees C.

On the other hand, two new samples were prepared by subjecting the sample having the first layer 71 having the thickness of 2 nm to heating treatment at a heating temperature of 330 degrees C. for different durations (two hours and three hours). FIG. 8 shows a relationship between a wavelength and a reflectance of each sample when the two prepared samples and the basic sample subjected to no heating treatment are irradiated with light having different wavelengths. It was found that the samples having the first layer 71 having the thickness of 2 nm and subjected to the heating treatment at the heating temperature of 330 degrees C. for different hours showed substantially the same characteristic curve as the basic sample. That is, the heating-treated samples having the first layer 71 having the thickness of 2 nm have a stable reflectance without a decrease in reflectance even when the heating temperature is increased to 330 degrees C.

Since the second layer 72 may have an effect (by galvanic corrosion) on the ITO layer 6 if the first layer 71 is too thin, the thickness of the first layer 71 may be set to 1 nm or more. However, the reflectance decreased when the first layer 71 (TiN) is not present, the reflectance decreased in a high temperature condition when the thickness of the first layer 71 is 1 nm (see FIG. 7), while the reflectance slightly decreased even in the high temperature condition when the thickness of the first layer 71 is 2 nm (see FIG. 8). Accordingly, it is believed that the reflectance does not decrease in a high temperature condition if the thickness of the first layer 71 is more than 2 nm.

Returning to FIG. 2, the second layer 72 is made of an Al-containing material (possibly Al alone). The second layer 72 is stacked on the first layer 71 in the same pattern as the first layer 71. Accordingly, when viewed from the top, a contour (region) of the first layer 71 is consistent with a contour (region) of the second layer 72. In addition, since the second layer 72 is stacked on the first layer 71 stacked on the ITO layer 6, only the first layer 71 is present between the second layer 72 and the ITO layer 6.

In addition, the entire reflective layer 7 is located between an outer contour and an inner contour of the ITO layer 6 (i.e., inside the region of the ITO layer 6). Accordingly, when viewed from the top, the ITO layer 6 has a stepped portion 6A projecting beyond a contour of the reflective layer 7. The insulating layer 8 is made of an insulating material containing one or more of silicon oxide (SiO$_2$), silicon oxynitride (SiON) and silicon nitride (SiN). The insulating layer 8 is stacked on the reflective layer 7. The insulating layer 8 has a cover portion 8A covering the entire front surface 7A of the reflective layer 7 (the upper surface of the second layer 72), and an extension portion 8B extending from an end portion of the cover portion 8A to the substrate 2 when viewed from the top, both of which are integrated. When viewed from the top, the extension portion 8B covers outer end surfaces of the light emitting layer 4, the second conductive type semiconductor layer 5, the ITO layer 6 and the reflective layer 7 (including the stepped portion 5A of the second conductive type semiconductor layer 5 and the stepped portion 6A of the ITO layer 6) and the stepped portion 3C of the first conductive type semiconductor layer 3.

An insulating tube layer 9 is extended from the insulating layer 8. The insulating tube layer 9 is made of an insulating material (the same material as the insulating layer 8 in this example). The insulating tube layer 9 is a tube-shaped layer which is continuous from the cover portion 8A of the insulating layer 8 and extends to the substrate 2 in the thickness direction of the substrate 2. The insulating tube layer 9 may be regarded as a part of the insulating layer 8. In this embodiment, the insulating tube layer 9 has a circular tubular shape, its outer diameter is equal to or more than 30 pm and equal to or less than 50 μm, and its thickness is 1 μm to 3 μm or so. The insulating tube layer 9 reaches to the middle of the thickness of the first conductive type semiconductor layer 3 through the reflective layer 7, the ITO layer 6, the second conductive type semiconductor layer 5 and the light emitting layer 4. The outer diameter of the insulating tube layer 9 is varied stepwise toward the substrate 2 along the stepped portion 5A of the second conductive type semiconductor layer 5 and the stepped portion 6A of the ITO layer 6.

In this embodiment, a plurality of insulating tube layers 9 is discretely arranged when viewed from the top. Specifically, the insulating tube layers 9 are uniformly distributed when viewed from the top. As shown in FIG. 1, the insulating tube layer 9 may be uniformly arranged in a matrix form along two intersecting directions (the longitudinal direction and lateral direction of the substrate 2) when viewed from the top or may be arranged in a staggered form when viewed from the top. In this embodiment, the number of insulating tube layers 9 is 15 which are arranged in a 3×5 matrix form. In this case, the row direction coincides with the lateral direction of the substrate 2 and the column direction coincides with the longitudinal direction of the substrate 2.

Referring to FIG. 2 again, the first external connection 10 is stacked on the left side of the cover portion 8A of the insulating layer 8. The first external connection 10 is exposed from the insulating layer 8. The first external connection 10 is formed in a longitudinal rectangular shape in the horizontal direction (the longitudinal direction of the substrate 2) of FIGS. 1 and 2 when viewed from the top, occupies more than half of the area of the insulating layer 8 (the cover portion 8A) when viewed from the top, and is in contact with the insulating layer 8 in the corresponding area (see FIG. 1). The first external connection 10 is made of a conductive material (for example, aluminum (Al) or sliver (Ag)). The thickness of the first external connection 10 may be 100 nm or more, more specifically about 350 nm. Referring to FIG. 1, the first external connection 10 includes a pair of long edges 10A extending in the horizontal direction in FIG. 1 and a pair of short edges 10B extending perpendicular to the pair of long edges 10A. The long edges 10A and the short edges 10B are sides that define the outline (contour) of the first external connection 10 when viewed from the top.

When viewed from the top, one of the insulating tube layers 9 is disposed at the center G of the rectangular first external connection 10, while the others are arranged in point symmetry with respect to the center G (the center of symmetry). In addition, the insulating tube layers 9A include edge-side insulating tube layers 9A arranged along the long edges 10A and the short edges 10B of the first external connection 10. In FIG. 1, 12 edge-side insulating tube layers 9A form a rectangular frame shape as a whole and are arranged adjacent to an outline (the long edges 10A and the short edges 10B) of the first external connection 10 so as to define the outline.

The first contact 11 is made of a conductive material (the same material as the first external connection 10 in this example). When the first contact 11 is made of the same material as the first external connection 10, it may be integrated with the first external connection 10 or may be considered as a part of the first external connection 10. The first contact 11 is formed in a columnar shape which is continuous from the first external connection 10 and extends to the substrate 2 in the thickness direction of the substrate 2. In this embodiment, the first contact 11 has a linear columnar shape and a plurality of first contacts 11 is provided. Further, the number of first contacts 11 provided is 15 which are equal to the number of insulating tube layers 9.

Referring to FIG. 2, each first contact 11 is embedded in a hollow portion of the corresponding insulating tube layer 9. In this state, the first contact 11 is connected to the first conductive type semiconductor layer 3 through the insulating layer 8 (the cover portion 8A) and the insulating tube layer 9. The first contact 11 is electrically isolated from the reflective layer 7, the ITO layer 6, the second conductive type semiconductor layer 5 and the light emitting layer 4 by passing though the insulating tube layer 9. That is, the insulating layer 8 (including the insulating tube layer 9) electrically isolates the first conductive type semiconductor layer 3 and the second conductive type semiconductor layer 5 from each other while protecting the ITO layer 6 and the reflective layer 7.

A contact portion 18 of the columnar first contact 11 to the first conductive type semiconductor layer 3 has a cylindrical shape. The diameter of the contact portion 18 may be, for example, equal to or more than 20 μm and equal to or less than 40 μm, more specifically about 30 μm in consideration of a dimensional error of the first contact 11 and an error of a distance between adjacent first contacts 11. If the diameter of the contact portion 18 is smaller than 20 μm, the electrical resistance (contact resistance) of the contact portion 18 increases.

Referring to FIG. 1, when viewed from the top, the circle center of the circular tubular insulating tube layer 9 coincides with the circle center of the columnar first contact 11 embedded in the hollow portion of the insulating tube layer 9. Therefore, when viewed from the top, the plurality of first contacts 11 is arranged in the same pattern as the insulating tube layers 9. That is, when viewed from the top, the plurality of first contacts 11 is uniformly distributed in a matrix form.

Referring to FIG. 2, in this embodiment, the second external connection 12 is made of the same material as the first external connection 10 and is stacked on the right side of the insulating layer 8 (the cover portion 8A). When viewed from the top, the second external connection 12 is smaller than the first external connection 10 but, for example, has the same thickness as the first external connection 10. The second external connection 12 is longitudinal in a direction (direction perpendicular to the plane of FIG. 2) perpendicular to the longitudinal direction (the horizontal direction in FIGS. 1 and 2) of the first external connection 10 (see FIG. 1). On the insulating layer 8, the first external connection 10 located on the left side and the second external connection 12 located on the right side are electrically isolated from each other by separating them from each other by, for example, a distance of about 60 μm.

The second contact 13 is made of a conductive material (the same material as the second external connection 12 in this example). The second contact 13 is formed in a columnar shape which is continuous from the second external connection 12 and extends to the substrate 2 in the thickness direction of the substrate 2. In this embodiment, a plurality of (3 in this example) second contacts 13 is provided. The plurality of second contacts 13 is lined up in the longitudinal direction (direction perpendicular to the plane of FIG. 2) of the second external connection 12 (see FIG. 1). Each second contact 13 is connected to the second layer 72 of the reflective layer 7 through the insulating layer 8.

The barrier layer 15 is stacked on the first external connection 10 in the same pattern as the first external connection 10 and is also stacked on the second external connection 12 in the same pattern as the second external connection 12. The barrier layer 15 is formed by sequentially stacking titanium (Ti) and platinum (Pt) in this order on the first external connection 10 and the second external connection 12. The bonding layer 16 is stacked on the barrier layer 15 of the first external connection 10 in the same pattern as the first external connection 10 and is also stacked on the barrier layer 15 of the second external connection 12 in the same pattern as the second external connection 12. The bonding layer 16 is made of, for example, Ag, Ti, Pt or an alloy thereof. The bonding layer 16 may be made of solder or AuSn (gold tin). In this embodiment, the bonding layer 16 is made of AuSn. The barrier layer 15 prevents Sn (tin) from being diffused from the bonding layer 16 into the first external connection 10 and the second external connection 12.

The first external connection 10, the first contact 11, the barrier layer 15 and the bonding layer 16 on the first external connection 10 form a first electrode 41. The second external connection 12, the second contact 13, the barrier layer 15 and the bonding layer 16 on the second external connection 12 form a second electrode 42. The bonding layer 16 has a lower surface contacting the barrier layer 15 on the first external connection 10 and the second external connection 12 and an opposite upper surface referred to as a bonding surface 16A. The bonding surface 16A of the bonding layer 16 on the first external connection 10 and the bonding surface 16A of the bonding layer 16 on the second external connection 12 are both flat and have the same height position (position in the thickness direction of the substrate 2). As described above, since the first external connection 10 and the second external connection 12 are separated and electrically isolated from each other, the bonding layer 16 on the first external connection 10 and the bonding layer 16 on the second external connection 12 are also separated and electrically isolated from each other.

When viewed from the top, the first conductive type semiconductor layer 3 (except the stepped portion 3C), the light emitting layer 4, the second conductive type semiconductor layer 5, the ITO layer 6 and the reflective layer 7 have substantially the same shapes and have a longitudinal rectangular shape in the horizontal direction (the longitudinal direction of the substrate 2) in FIGS. 1 and 2 (see FIG. 1). The first conductive type semiconductor layer 3, the light emitting layer 4, the second conductive type semiconductor layer 5, the ITO layer 6 and the reflective layer 7 are present in a region where the insulating tube layer 9 and the first contact 11 are not present, over the entire range in the longitudinal direction of the substrate 2 (see FIG. 3). When viewed from the top, the first external connection 10, the second external connection 12, the barrier layer 15 and the bonding layer 16 are located inside the light emitting layer 4 (the second conductive type semiconductor layer 5, the ITO layer 6 and the reflective layer 7) (see FIG. 1).

In the light emitting element 1, when a forward voltage is applied between the first external connection 10 and the second external connection 12, a current flows from the second external connection 12 toward the first external connection 10. The current sequentially flows through the second contact 13 and the reflective layer 7 in this order from the second external connection 12 toward the first external connection 10. Since the reflective layer 7 has a good conductivity, the current spreads throughout the reflective layer 7 when viewed from the top, and then sequentially flows through the ITO layer 6, the second conductive type semiconductor layer 5, the light emitting layer 4, the first conductive type semiconductor layer 3 and the first contact 11 in this order. When the current flows in this way, electrons are injected from the first conductive type semiconductor layer 3 into the light emitting layer 4 and holes are injected from the second conductive type semiconductor layer 5 into the light emitting layer 4. The electrons and the holes are recombined in the light emitting layer 4 to emit blue light having a wavelength of 440 nm to 460 nm. The blue light sequentially transmits through the first conductive type semiconductor layer 3 and the substrate 2 in this order and is externally extracted from the front surface 2A of the substrate 2.

At this time, light propagating from the light emitting layer 4 to the second conductive type semiconductor layer 5 is also present. This light sequentially transmits through the second conductive type semiconductor layer 5 and the ITO layer 6 in this order. This light is reflected at an interface between the ITO layer 6 and the reflective layer 7 and an interface between the first layer 71 and the second layer 72 in the reflective layer 7. The reflected light sequentially transmits through the ITO layer 6, the second conductive type semiconductor layer 5, the light emitting layer 4, the first conductive type semiconductor layer 3 and the substrate 2 in this order and is extracted from the front surface 2A of the substrate 2.

In addition, light propagating into the insulating tube layer 9 without being reflected at the reflective layer 7 is also present. This light transmits through the insulating tube layer 9 and the insulating layer 8 and is reflected at an interface between the insulating layer 8 and the first and second external connections 10 and 12. The reflected light transmits through the insulating layer 8, the insulating tube layer 9, the ITO layer 6, the second conductive type semiconductor layer 5, the light emitting layer 4, the first conductive type semiconductor layer 3 and the substrate 2 and is extracted from the front surface 2A of the substrate 2. That is, the light emitting element 1 includes the reflective layer 7 as a first reflective electrode layer and the first and second external connections 10 and 12 as a second reflective electrode layer. In order for the first and second external connections 10 and 12 to function as reflective electrode layers, the thickness of the first and second external connections 10 and 12 needs to be 100 nm or more. As described above, the plurality of convex portions 17 is formed in the rear surface 2B of the substrate 2. These convex portions 17 can prevent the incident light propagating to the rear surface 2B of the substrate 2 at different angles from the first conductive type semiconductor layer 3 toward the substrate 2 from being totally reflected at the rear surface 2B of the substrate 2. Accordingly, the light propagating from the first conductive type semiconductor layer 3 toward the substrate 2 can be prevented from being totally reflected at an interface between the first conductive type semiconductor layer 3 and the substrate 2 toward the first conductive type semiconductor layer 3. In addition, each convex portion 17 can lead light diffusely reflected and staying in the first conductive type semiconductor layer 3 to the substrate 2, thereby providing increased efficiency of light extraction.

As described above, in the light emitting element 1, the light from the light emitting layer 4 may be instantly emitted from the front surface 2A of the substrate 2 or may be also emitted from the light emitting layer 4 after transmitting through the ITO layer 6 toward the rear surface 2B of the substrate 2 and then being reflected at the reflective layer 7. In the reflective layer 7 stacked on the ITO layer 6, the first layer 71 containing Ti is interposed between the second layer 72 containing Al and the ITO layer 6. Accordingly, a contact between the second layer 72 and the ITO layer 6 is avoided and the first layer 71 protects the ITO layer 6 from the second layer 72, thereby preventing the ITO layer 6 from being galvanically corroded. Such prevention of the ITO layer 6 from being corroded can result in improved electrical characteristics of the light emitting element 1. On the other hand, the first layer 71 containing Ti can protect the ITO layer 6 without affecting the reflectance of the second layer 72, which can result in an increase in the reflectance of the reflective layer 7 as compared to the case where the first layer 71 is not formed.

That is, it is possible to increase the reflectance of the reflective layer 7 while preventing the corrosion of the ITO layer 6. In other words, it is possible to increase the reliability of the light emitting element 1 by employing the reflective layer 7 having a double-layered structure including the first layer 71 and the second layer 72. Further, since the thickness of the first layer 71 and the reflectance of the reflective layer 7 are related as described above (see FIGS. 5 to 8), the reflectance of the reflective layer 7 may be further improved if the thickness of the first layer 71 is equal to or more than 1 nm and equal to or less than 10 nm.

Figure 9A:
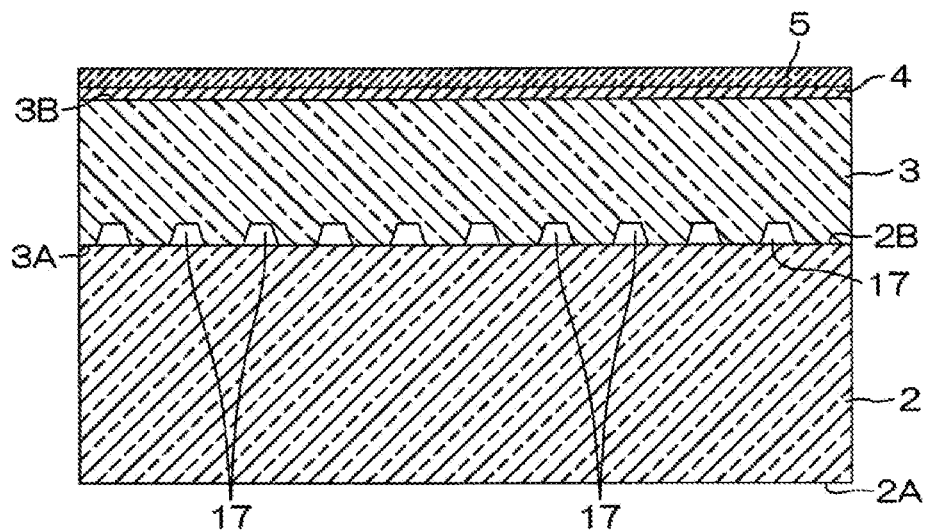
FIG. 9A is a schematic sectional view illustrating a method of manufacturing the light emitting element shown in FIG. 2.

In addition, since only the first layer 71 is present between the second layer 72 and the ITO layer 6, it is possible to further increase the reflectance of the reflective layer 7 as compared to the case where one or more different layers are present therebetween in addition to the first layer 71. FIGS. 9A to 9G are schematic sectional views illustrating a method of manufacturing the light emitting element 1 shown in FIG. 2. As shown in FIG. 9A, a layer made of SiN (a SiN layer) is first formed on the rear surface 2B of the substrate 2 and is separated into a plurality of convex portions 17 by means of an etching process using a resist pattern (not shown) as a mask. Subsequently, the substrate 2 is placed in a reaction container (not shown) and a semiconductor layer is epitaxially grown on the rear surface 2B by introducing a gas (such as a silane gas or the like) into the reaction container. At this time, by changing a flow rate of the gas, the first conductive type semiconductor layer 3, the light emitting layer 4 and the second conductive type semiconductor layer 5 can be successively formed in this order on the rear surface 2B of the substrate 2.

Figure 9B:
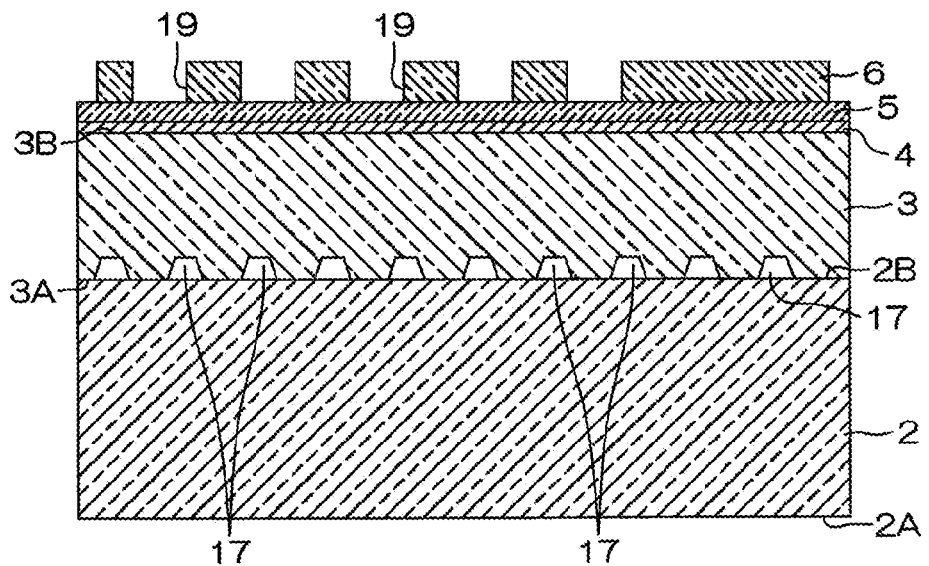
FIG. 9B is a schematic sectional view showing a process subsequent to FIG. 9A.

Next, as shown in FIG. 9B, for example, a lift-off method is used to form the ITO layer 6. The ITO layer 6 may be formed using an etching process. The ITO layer 6 is formed in a pattern having through holes 19 penetrating through the ITO layer 6 at positions where respective insulating tube layers 9 are positioned (see FIGS. 1 and 2). Portions of the second conductive type semiconductor layer 5 are exposed from the through holes 19.

Next, the reflective layer 7 is entirely formed on the ITO layer 6 and the portions of the second conductive type semiconductor layer 5 exposed from the through holes 19. In this embodiment, specifically, a layer (first reflective layer) made of a Ti-containing material (TiN in this embodiment) is entirely formed on the ITO layer 6 and the portions of the second conductive type semiconductor layer 5 exposed from the through holes 19. Next, a layer (second reflective layer) made of a material such Al or the like (Al alone in this embodiment) is entirely formed on the first reflective layer. The first reflective layer and the second reflective layer may be formed by sputtering.

Figure 9C:
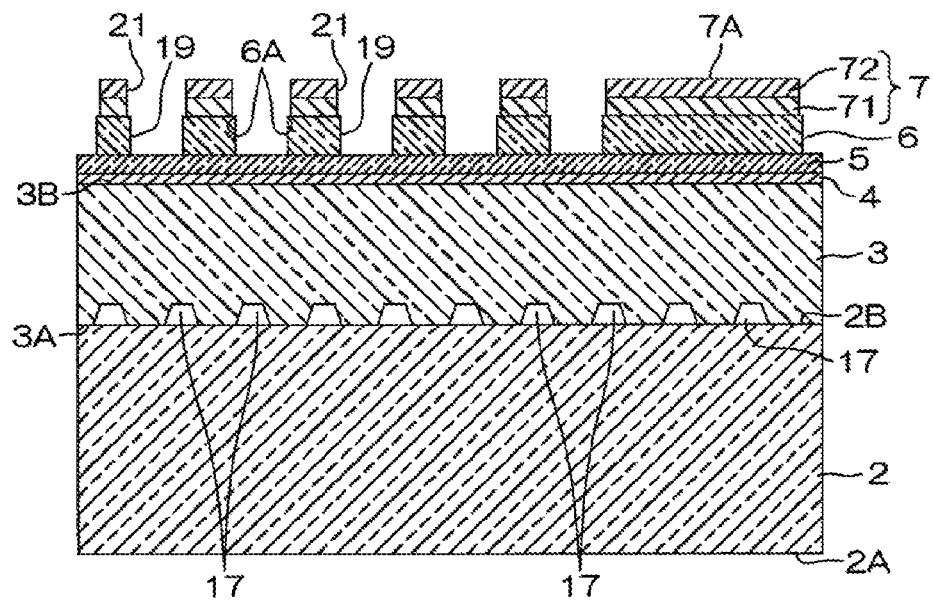
FIG. 9C is a schematic sectional view showing a process subsequent to FIG. 9B.

Then, the first reflective layer and the second reflective layer are subjected to a dry etching process using substantially the same resist pattern (not shown) as the ITO layer 6 as a mask. Accordingly, the first reflective layer and the second reflective layer are selectively removed in a collective manner. Referring to FIG. 9C, a portion of the first reflective layer left after the removal serves as the first layer 71 and is formed on the ITO layer 6 in substantially the same pattern as the ITO layer 6. Similarly, a portion of the second reflective layer left after the removal serves as the second layer 72 and is formed on the first layer 71 in substantially the same pattern as the first layer 71. Thus, the reflective layer 7 having the first layer 71 and the second layer 72 is formed. The resist pattern used herein for the etching has through holes slightly larger than the above-mentioned through holes 19. Accordingly, the reflective layer 7 has through holes 21 which are slightly larger than the through holes 19 of the ITO layer 6 and are formed at positions where the through holes 19 are positioned when viewed from the top. Accordingly, the above-mentioned stepped portion 6A is provided in the ITO layer 6 after the reflective layer 7 is formed. By providing the stepped portion 6A in this manner, even if there are some errors in the size of the reflective layer 7, the reflective layer 7 can be formed reliably so as not to protrude from the ITO layer 6.

Figure 9D:
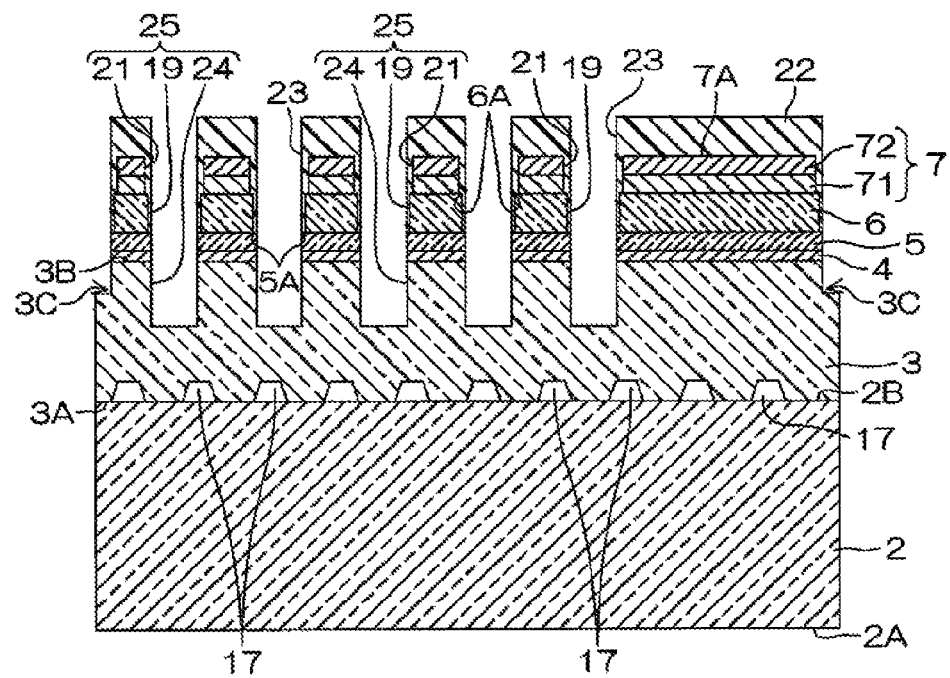
FIG. 9D is a schematic sectional view showing a process subsequent to FIG. 9C.

Next, as shown in FIG. 9D, the earlier resist pattern (not shown) is removed and another resist pattern 22 is formed on the reflective layer 7. The resist pattern 22 has openings 23 which are slightly smaller than the through holes 19 of the ITO layer 6 and formed at positions where with the through holes 19 are positioned when viewed from the top. The openings 23 are continuous to the through holes 19 and 21 in the same position when viewed from the top. The resist pattern 22 covers the side portions of the ITO layer 6 and the reflective layer 7. On the other hand, the resist pattern 22 is not present in a portion where the stepped portion 3C of the first conductive type semiconductor layer 3 is to be located, when viewed from the top.

Next, the second conductive type semiconductor layer 5, the light emitting layer 4 and the first conductive type semiconductor layer 3 are selectively removed by a dry etching process using the resist pattern 22 as a mask. Accordingly, when viewed from the top, trenches 24 (cylindrical trenches in this embodiment) reaching to the middle of the thickness of the first conductive type semiconductor layer 3 through the second conductive type semiconductor layer 5 and the light emitting layer 4 are formed at positions where the openings 23 of the resist pattern 22 is positioned and the stepped portion 3C is formed in the first conductive type semiconductor layer 3. The trenches 24 are continuous to the openings 23 and the through holes 19 and 21 in the same position when viewed from the top. Since the trenches 24 have the same diameter as the openings 23 and are slightly smaller in diameter than the through holes 19 of the ITO layer 6, the above-mentioned stepped portion 5A is provided in the second conductive type semiconductor layer 5 after the trenches 24 are formed.

When viewed from the top, the through holes 19 and 21 and the trench 24 that are continuous in the same position constitute a single trench 25. When viewed from the top, the trench 25 is formed at a plurality of (15 in this example) distributed positions where the insulating tube layers 9 are positioned when viewed from the top. In this embodiment, each trench 25 has a cylindrical shape in the thickness direction of the substrate 2. The diameter of each trench 25 is stepwisely varied toward the substrate 2 in corresponding to the stepped portion 5A of the second conductive type semiconductor layer 5 and the stepped portion 6A of the ITO layer 6. Each trench 25 reaches to the middle of the thickness of the first conductive type semiconductor layer 3 through the reflective layer 7, the ITO layer 6, the second conductive type semiconductor layer 5 and the light emitting layer 4. The depth of the trench 25 from the front surface of the second conductive type semiconductor layer 5 (i.e., the dimension of the trench 25 in the thickness direction of the substrate 2) is, for example, about 1.5 μm. In addition, a portion (see FIG. 9C) where the stepped portion 3C in each of the first conductive type semiconductor layer 3, the light emitting layer 4 and the second conductive type semiconductor layer 5 are positioned, when viewed from the top, is removed at the same time when the trenches 25 are formed by the dry etching.

Figure 9E:
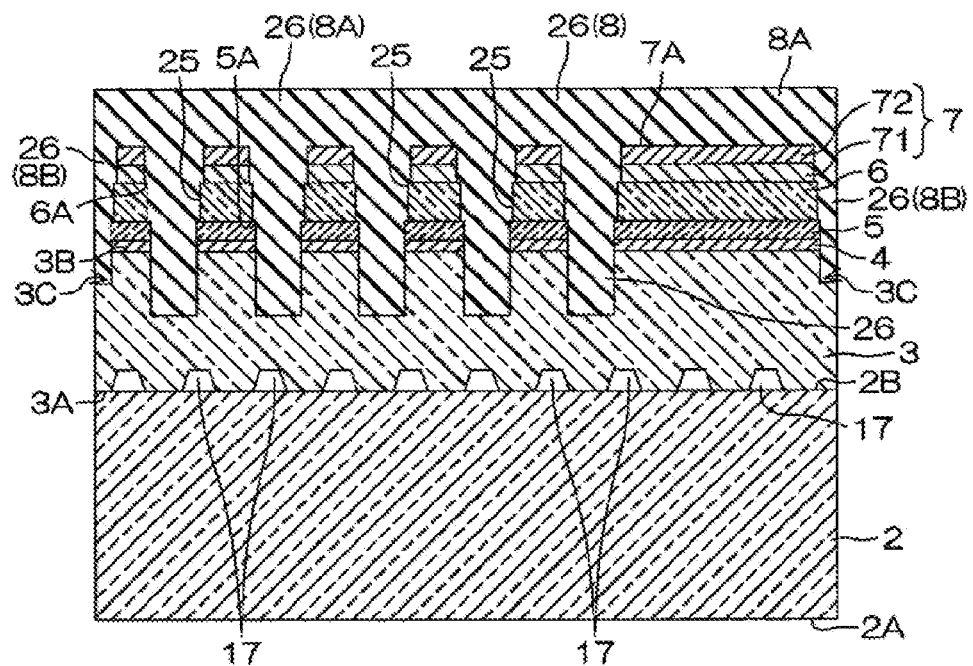
FIG. 9E is a schematic sectional view showing a process subsequent to FIG. 9D.

Next, the resist pattern 22 is removed and, as shown in FIG. 9E, a layer 26 made of SiN (SiN layer) is formed on the reflective layer 7 using, for example, a CVD method. The SiN layer 26 is fully filled in each trench 25 and is entirely formed to cover outer end surfaces of the light emitting layer 4, the second conductive type semiconductor layer 5, the ITO layer 6 and the reflective layer 7 (including the stepped portion 5A of the second conductive type semiconductor layer 5 and the stepped portion 6A of the ITO layer 6) and the stepped portion 3C of the first conductive type semiconductor layer 3 when viewed from the top. A portion of the SiN layer 26 on the reflective layer 7 becomes the cover portion 8A of the insulating layer 8 and a portion thereof covering the outer end surfaces of the light emitting layer 4, the second conductive type semiconductor layer 5, the ITO layer 6 and the reflective layer 7 and the stepped portion 3C of the first conductive type semiconductor layer 3 when viewed from the top becomes the extension portion 8B. In addition, a portion of the SiN layer 26 embedded in the trench 25 forms the insulating tube layer 9.

Figure 9F:
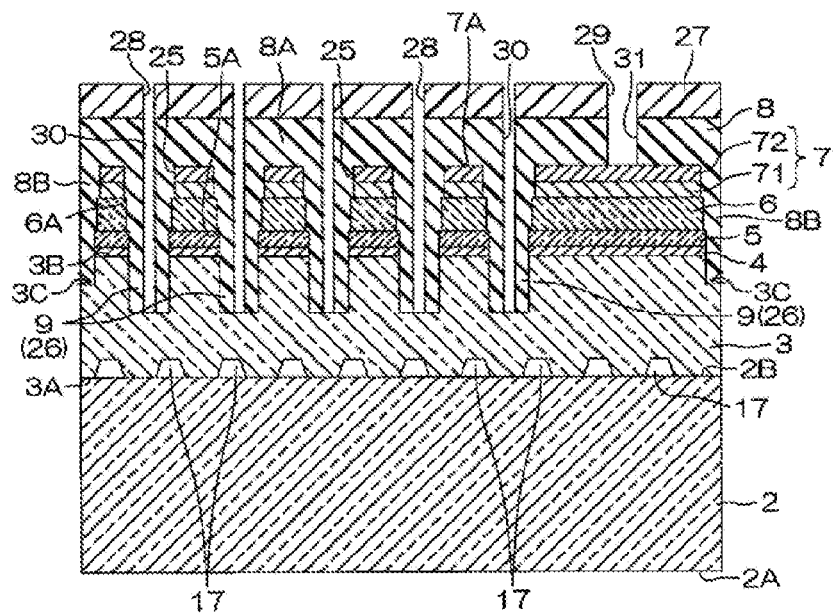
FIG. 9F is a schematic sectional view showing a process subsequent to FIG. 9E.

Next, as shown in FIG. 9F, a resist pattern 27 is formed on the insulating layer 8. The resist pattern 27 has openings 28 formed at planned positions where the first contacts 11 is positioned (see FIG. 2) when viewed from the top and openings 29 formed at positions where the second contacts 13 (see FIG. 2) are positioned when viewed from the top. Next, the insulating layer 8 and the SiN layer 26 in each trench 25 are selectively removed by a dry etching process using the resist pattern 27 as a mask. Accordingly, the insulating layer 8 and the SiN layer 26 at positions where the openings 28 of the resist pattern 27 are positioned when viewed from the top are removed from the resist pattern 27. In this dry etching, it is imperative that the first conductive type semiconductor layer 3 and the reflective layer 7 are not etched. Accordingly, etching in each opening 28 stops before the first conductive type semiconductor layer 3 at the bottom surface of the trench 25. In addition, etching in each opening 29 stops before the reflective layer 7.

As a result of the dry etching, trenches 30 reaching to the first conductive type semiconductor layer 3 through the insulating layer 8 and the SiN layer 26 are formed at positions where the openings 28 of the resist pattern 22 are positioned when viewed from the top. Each trench 30 has a cylindrical shape extending in the thickness direction of the substrate 2 and a circular section thereof has the same size over the entire region in the thickness direction of the substrate 2. The number of trenches 30 is equal to the number of first contacts 11 (15 in this example) and each trench 30 is located in the inner side of any trench 25. Since each trench 25 reaches to the middle of the thickness of the first conductive type semiconductor layer 3, each trench 30 also reaches to the middle of the thickness of the first conductive type semiconductor layer 3. The first conductive type semiconductor layer 3 is exposed in the bottom of each trench 30. The SiN layer 26 fully filled in each trench 25 serves as the insulating tube layer 9 when the trenches 30 are formed.

In addition, trenches 31 extending to the reflective layer 7 through the insulating layer 8 are formed by the same dry etching at positions where the openings 29 of the resist pattern 27 are positioned when viewed from the top. The number of trenches 31 is equal to the number of second contacts 13 (3 in this example) and the trenches 31 are lined up in uniform intervals in the lateral direction of the substrate 2 (a direction perpendicular to the plane of FIG. 9F) when viewed from the top.

Figure 9G:
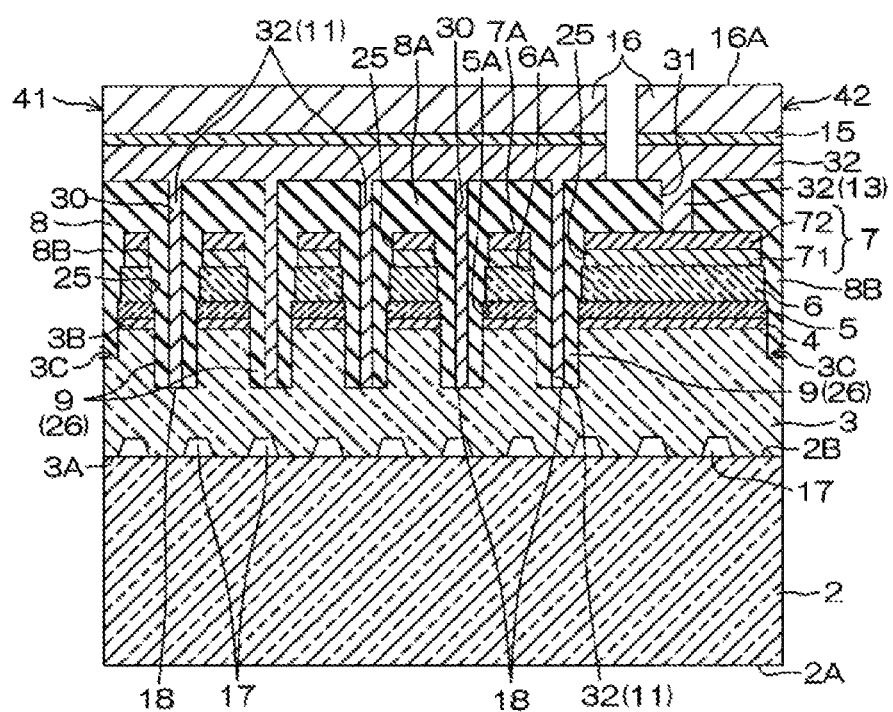
FIG. 9G is a schematic sectional view showing a process subsequent to FIG. 9F.

Next, the resist pattern 27 is removed and, as shown in FIG. 9G, a layer made of Al (Al layer 32) is formed on the entire surface of the insulating layer 8 by, for example, deposition. The Al layer 32 is fully filled in each trench 30 and each trench 31. The Al layer 32 in the trench 30 serves as the first contact 11 and the Al layer 32 in the trench 31 serves as the second contact 13.

Next, a layer made of Ti (Ti layer) and a layer made of Pt (Pt layer) are sequentially stacked on the entire surface of the Al layer 32 on the insulating layer 8 in this order from the Al layer 32 by, for example, a sputtering method. Accordingly, a barrier layer 15 having a stacked structure including the Ti layer and the Pt layer is formed on the Al layer 32. Next, a layer made of AuSn (AuSn layer) is formed on the entire surface of the barrier layer 15 by, for example, an electroplating method. The AuSn layer corresponds to the bonding layer 16.

Next, by an etching process using a resist pattern (not shown) as a mask, each of the Al layer 32, the barrier layer 15 and the bonding layer 16 on the insulating layer 8 is divided between the second contact 13 and the first contact 11 closest to the second contact 13 in the longitudinal direction of the substrate 2 when viewed from the top (see FIG. 9G). Thus, as shown in FIG. 2, a portion of the Al layer 32 on the insulating layer 8 covering all of the first contacts 11 when viewed from the top serves as the first external connection 10 and a portion thereof covering all of the second contacts 13 when viewed from the top serves as the second external connection 12. The first external connection 10 and the second external connection 12 are formed on the insulating layer 8 with them separated and electrically isolated from each other.

In addition, the Al layer 32, the barrier layer 15 and the bonding layer 16 of FIG. 9G may be formed by a lift-off method using a resist pattern. In this case, the resist pattern is first formed, the Al layer 32, the barrier layer 15 and the bonding layer 16 are sequentially formed using a deposition method or a sputtering method, and the resist pattern is then removed, thereby forming the structure shown in FIG. 9G. As a result of the above-described processes, the light emitting element 1 is completed.

For example, a plurality of light emitting elements 1 is simultaneously formed on one wafer (not shown) serving as an original substrate for the substrate 2. Accordingly, after grinding and polishing the wafer to adjust its thickness as necessary, the wafer is diced using a laser scriber or the like, which results in individual light emitting elements 1, each of which has the structure shown in FIGS. 1 to 4. The trench 30 filled with the first contact 11 has a circular section of the same size as the first contact 11 and the (inner) diameter thereof is equal to or more than 20 μm and equal to or less than 40 μm. In contrast, the trench 31 filled with the second contact 13 is larger than the trench 30 (see FIG. 1) when viewed from the top. Accordingly, as described above, when the Al layer 32 is formed on the insulating layer 8 (see FIG. 9G), a dented trace 90 of the trench 31 appears in the insulating layer 8 when the trench 31 is fully filled with the Al layer 32, and finally also appears in the bonding surface 16A of the bonding layer 16 on the second external connection 12 (see FIG. 4). However, since the plurality of trenches 31 is separated from one another at intervals in the lateral direction of the substrate 2 (see FIG. 1), the trace 90 of each trench 31 is minute and inconspicuous as compared to the case where these trenches 31 are connected in a row. Accordingly, the bonding surface 16A of the bonding layer 16 on the second external connection 12 is substantially flat.

Figure 10:
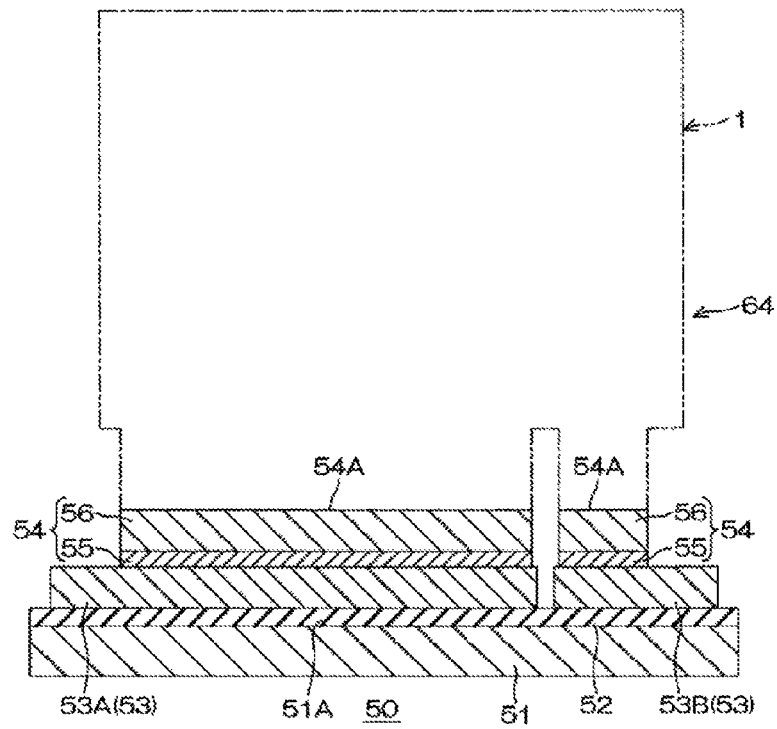
FIG. 10 is a sectional view schematically illustrating a structure of a sub-mount.

FIG. 10 is a sectional view schematically showing a structure of a sub-mount 50. As indicated by a two-dot chain line in FIG. 10, the light emitting element 1 is bonded to the sub-mount 50 by the bonding layer 16. The light emitting element 1 and the sub-mount 50 constitute a light emitting element unit 64. The sub-mount 50 includes a sub-mount substrate 51, an insulating layer 52, an electrode layer 53 and a bonding layer 54.

The sub-mount substrate 51 is made of, for example, Si. The insulating layer 52 is made of, for example, $SiO_2$ and covers the entire surface 51A (e.g., the upper surface in FIG. 10) of the sub-mount substrate 51. The electrode layer 53 is made of, for example, Al. The electrode layer 53 is provided in two separated regions on the insulating layer 52. As shown in FIG. 10, two electrode layers 53 are formed on the insulating layer 52 with them horizontally isolated from each other. In FIG. 10, the left one of the two electrode layers 53 is referred to as a first mount electrode layer 53A and the right one is referred to as a second mount electrode layer 53B. The first mount electrode layer 53A and the second mount electrode layer 53B are separated and electrically isolated from each other at a distance substantially equal to a distance between the first external connection 10 and the second external connection 12, for example, at a distance of about 60 μm.

The bonding layer 54 is stacked on each electrode layer 53. In this embodiment, the bonding layer 54 has a double-layered structure including a Ti layer 55 on the sub-mount substrate 51 side and an Au layer 56 stacked on the Ti layer 55. A surface (e.g., the upper surface in FIG. 10) of the bonding layer 54 in the opposite side to a surface thereof contacting the electrode layer 53 is referred to as a front surface 54A. The front surface 54A is flat. The front surfaces 54A of the bonding layers 54 on the electrode layers 53 are flush with each other.

Figure 11:
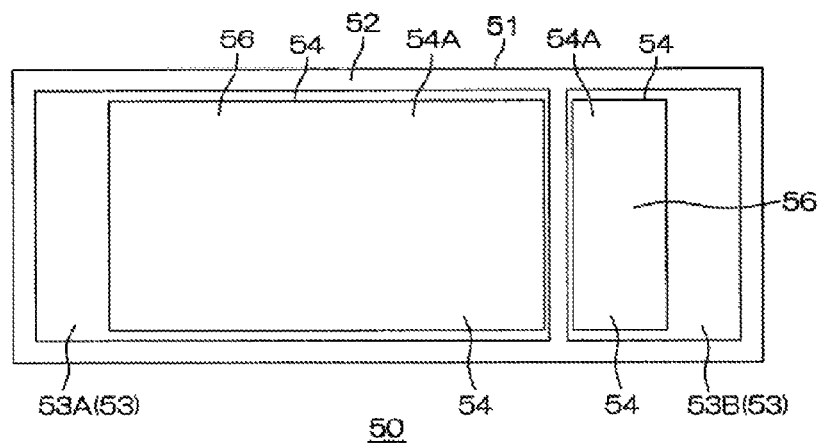
FIG. 11 is a schematic plane view of the sub-mount.

FIG. 11 is a schematic plan view of the sub-mount 50. When viewed from the top, the bonding layer 54 on the first mount electrode layer 53A has the same size as the bonding layer 16 on the first external connection 10 of the light emitting element 1 and the bonding layer 54 on the second mount electrode layer 53B has the same size as the bonding layer 16 on the second external connection 12 of the light emitting element 1 (see FIG. 1).

FIG. 12A is a sectional view schematically showing a structure of a light emitting device 60. Referring to FIG. 12A, the light emitting device 60 includes the light emitting element unit 64 (the light emitting element 1 and the sub-mount 50) and a supporting substrate 61. The supporting substrate 61 includes an insulating substrate 62 made of an insulating material and a pair of metal leads 63 which is provided to be exposed from both ends of the insulating substrate 62 and electrically interconnects the light emitting element 1 and outside components (not shown). The insulating substrate 62 is, for example, formed in a rectangular shape when viewed from the top and the pair of metal leads 63 is formed in a band shape along a pair of opposing sides. The pair of metal leads 63 is folded to reach from an upper surface of the insulating substrate 62, through a lateral side thereof, to a lower surface thereof along a pair of edges of the insulating substrate 62 and is formed to have a lateral U-like section.

In assembly of the light emitting element unit 64, for example, as shown in FIG. 12A, the sub-mount 50 is positioned such that the front surface 54A of the bonding layer 54 faces upward. In addition, the light emitting element 1 shown in FIG. 2 is positioned such that the bonding surface 16A of the bonding layer 16 faces downward (i.e., is positioned to be reverse to that shown in FIG. 2), and faces the sub-mount 50 from above in the position shown in FIG. 12A. When approaching the light emitting element 1 to the sub-mount 50, the bonding surface 16A of the bonding layer 16 of the light emitting element 1 makes surface contact with the front surface 54A of the bonding layer 54 of the sub-mount 50, as shown in FIG. 12A. Specifically, the bonding surface 16A of the bonding layer 16 in the first external connection 10 side makes surface contact with the front surface 54A of the bonding layer 54 in the first mount electrode layer 53A side and the bonding surface 16A of the bonding layer 16 in the second external connection 12 side makes surface contact with the front surface 54A of the bonding layer 54 in the second mount electrode layer 53B side. By performing reflow (heat treatment) under this state, the first external connection 10 and the first mount electrode layer 53A are bonded to each other via these bonding layers 16 and 54 and the second external connection 12 and the second mount electrode layer 53B are bonded to each other via these bonding layers 16 and 54. When the bonding layer 16 and the bonding layer 54 are melted and adhered to be bonded to each other, the light emitting element 1 is bonded to the sub-mount substrate 51 of the sub-mount 50 via the electrode layer 53 and the bonding layer 54, thereby achieving flip-chip connection of the light emitting element 1 to the sub-mount 50. As a result of the flip-chip connection, the light emitting element unit 64 including the light emitting element 1 and the sub-mount 50 which are integrated can be obtained.

As described above, the bonding surface 16A of the bonding layer 16 on the second external connection 12 is substantially flat since the trace 90 of each trench 31 is very small if any (see FIG. 4). Accordingly, the trace 90 of each trench 31 does not affect the surface contact between the bonding surface 16A and the front surface 54A of the bonding layer 54 in the second mount electrode layer 53B side, and thus the bonding surface 16A makes surface contact with the front surface 54A over almost the entire region. In addition, the first external connection 10 and the second external connection 12 in the light emitting element 1 side are separated from each other by a sufficient distance of about 60 µm and, similarly, the first mount electrode layer 53A and the second mount electrode layer 53B in the sub-mount 50 side are separated from each other by a sufficient distance. Accordingly, even if there may be some errors in mounting, the first external connection 10 cannot be connected to the second mount electrode layer 53B and the second external connection 12 cannot be connected to the first mount electrode layer 53A, thereby ensuring flip-chip connection of the light emitting element 1 to the sub-mount 50.

By facing the sub-mount substrate 51 of the sub-mount 50 to one surface of the insulating substrate 62, the light emitting element unit 64 is bonded to the insulating substrate 62. Then, the first mount electrode layer 53A connected to the first external connection 10 is connected to the metal lead 63 in the first mount electrode layer 53A side by a bonding wire 65. Similarly, the second mount electrode layer 53B connected to the second external connection 12 is connected to the metal lead 63 in the second mount electrode layer 53B side by a bonding wire 65. As a result, the light emitting device 60 including the light emitting element unit 64 and the supporting substrate 61 which are integrated can be obtained.

Figure 12B:
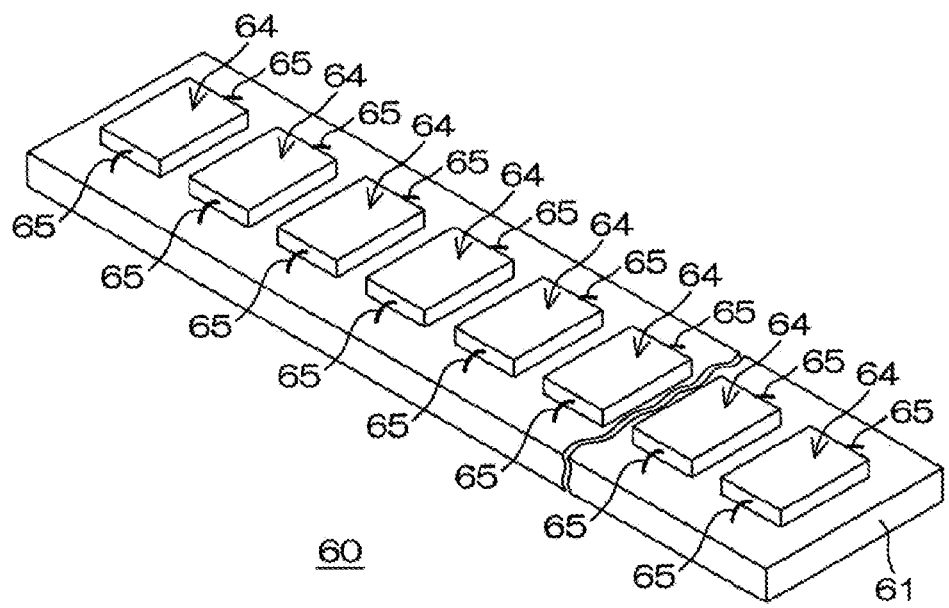
FIG. 12B is a schematic perspective view showing a configuration example of the light emitting element.

As shown in a schematic perspective view of FIG. 12B, the supporting substrate 61 may be formed in an elongated shape (strip shape) and a plurality of light emitting element units 64 mounted on the surface of the elongated supporting substrate 61 may form an LED (Light Emitting Diode) bar. FIG. 12B shows a light emitting device 60 including a plurality of light emitting element units 64 arranged in a row in a straight line on one surface of the supporting substrate 61. Such a light emitting device 60 may be, for example, used as a backlight source for a liquid crystal display. The plurality of light emitting element units 64 on the supporting substrate 61 is not necessarily arranged in a row in a straight line but may be arranged in two rows or in a staggered fashion. In addition, a sealing resin containing a fluorescent material may be posted on each light emitting element unit 64.

Figure 13:
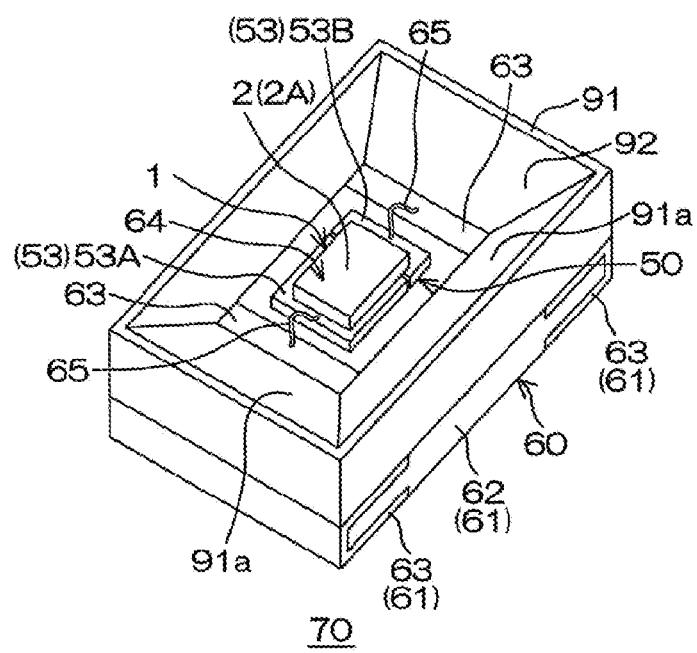
FIG. 13 is a schematic perspective view of a light emitting element package.

FIG. 13 is a schematic perspective view of a light emitting element package 70 using the light emitting element unit 64. The light emitting element package 70 includes a light emitting device 60 having the structure shown in FIG. 12A, a package 91 and a sealing resin 92. The package 91 is a ring-like case filled with a resin and is fixed to the supporting substrate 61 under a state where the package 91 accommodates (covers) the light emitting element unit 64 (the light emitting element 1), while surrounding and protecting the light emitting element unit 64 from the lateral side. Under this state, the light emitting element 1 of the light emitting element unit 64 has an exposed front surface 2A serving as a light extraction surface in the substrate 2. The inner wall of the package 91 forms a reflective surface 91a for reflecting light emitted from the light emitting element 1 of the light emitting element unit 64 for external extraction of the light. In this embodiment, the reflective surface 91a includes an inclination surface inclined so as to move the supporting substrate 61 toward the inside and is configured to reflect the light from the light emitting element 1 toward a light extraction direction (a direction normal to the front surface 2A of the substrate 2).

The sealing resin 92 is formed by a transparent resin (for example, silicone, epoxy or the like) transparent to an emission wavelength of the light emitting element 1 and seals the light emitting element 1, the bonding wires 65 and so on. This transparent resin may be mixed with a fluorescent material. When the light emitting device 60 is of a blue emission type and the fluorescent material is of a yellow emission type, white emission can be obtained. Although FIG. 13 shows a structure where one light emitting element unit 64 is mounted on the supporting substrate 61, it is to be understood that a plurality of light emitting element units 64 may be mounted on the same supporting substrate 61 and may be sealed in common by the sealing resin 92.

Figure 14:
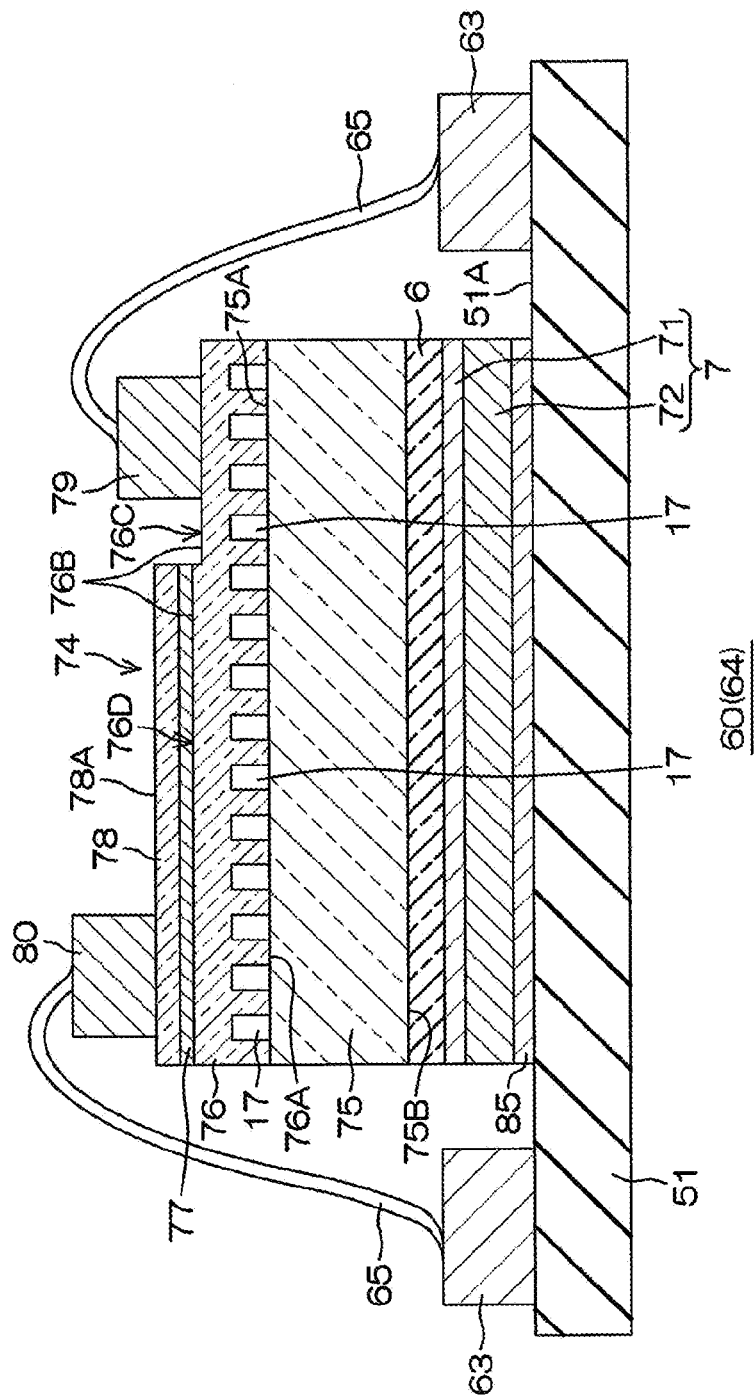
FIG. 14 is a schematic sectional view of a light emitting element according to another embodiment of the present disclosure.

FIG. 14 is a schematic sectional view of a light emitting element 74 according to another embodiment of the present disclosure. While the earlier-described light emitting element 1 is of, so-called, a flip type, the light emitting element 74 is of, so-called, a two-wire type. The light emitting element 74 includes a substrate 75, a first conductive type semiconductor layer 76, a light emitting layer 77, a second conductive type semiconductor layer 78, a first electrode 79, a second electrode 80, the above-described ITO layer 6 and the above-described reflective layer 7.

The substrate 75 is made of, for example, sapphire and has a predetermined thickness. The substrate 75 is formed in a rectangular shape having a longitudinal direction in the horizontal direction in FIG. 14 and a lateral direction in the depth direction in FIG. 14 when viewed in the thickness direction from the top. In FIG. 14, an upper surface of the substrate 75 corresponds to a front surface 75A serving as a light extraction surface and a lower surface thereof corresponds to a rear surface 75B in the opposite side to the light extraction surface 75A. The front surface 75A is a bonding surface of the substrate 75 with the first conductive type semiconductor layer 76 and the rear surface 75B is a bonding surface of the substrate 75 with the ITO layer 6. The front surface 75A of the substrate 75 is formed with a plurality of convex portions 17, as described above. The substrate 75 is transparent to an emission wavelength of the light emitting layer 77.

The first conductive type semiconductor layer 76 is stacked on the substrate 75. The first conductive type semiconductor layer 76 covers the front surface 75A of the substrate 75 entirely. The first conductive type semiconductor layer 76 is made of an n-type nitride semiconductor (for example, GaN). In the first conductive type semiconductor layer 76, a lower surface covering the front surface 75A of the substrate 75 in FIG. 14 is referred to as a rear surface 76A and an upper surface in the opposite side to the rear surface 76A is referred to as a front surface 76B. In the front surface 76B, a first region 76C in the right side of FIG. 14 is lowered to the rear surface 76A side than a second region 76D in the left side of FIG. 14.

The light emitting layer 77 is stacked on the first conductive type semiconductor layer 76. The light emitting layer 77 covers the entire second region 76D in the front surface 76B of the first conductive type semiconductor layer 76. In this embodiment, the light emitting layer 77 is made of an In-containing nitride semiconductor (for example, InGaN). The second conductive type semiconductor layer 78 is stacked on the light emitting layer 77 in the same pattern as the light emitting layer 77. Accordingly, when viewed from the top, a region of the second conductive type semiconductor layer 78 is aligned with a region of the light emitting layer 77. The second conductive type semiconductor layer 78 is made of a p-type nitride semiconductor (for example, GaN) and is transparent to an emission wavelength of the light emitting layer 77. In this manner, a light emitting diode structure is formed, which includes the first conductive type semiconductor layer 76 serving as an n-type semiconductor layer, the second conductive type semiconductor layer 78 serving as a p-type semiconductor layer, and the light emitting layer 77 interposed therebetween.

The first electrode 79 is stacked on the first region 76C in the front surface 76B of the first conductive type semiconductor layer 76. The first electrode 79 is formed by stacking Ti and Al on the front surface 76B. The second electrode 80 has the same configuration as the first electrode 79 and is stacked on the second conductive semiconductor layer 78. The ITO layer 6 is disposed on the rear surface 75B of the substrate 75 and covers the entire rear surface 75B, similar to the embodiment described above (see FIG. 2).

The reflective layer 7 is stacked on the ITO layer 6 in the opposite side to the substrate 75, similar to the embodiment described above (see FIG. 2). The reflective layer 7 includes the above-described first layer 71 and second layer 72. The first layer 71 is stacked on the ITO layer 6 in contact with the ITO layer 6 and the second layer 72 is stacked on the first layer 71 in the opposite side to the ITO layer 6. Accordingly, only the first layer 71 is present between the second layer 72 and the ITO layer 6. The first layer 71 and the second layer 72 have the same dimension (thickness) and material similar to the embodiment described above (see FIG. 2).

In the light emitting element 74, when a forward voltage is applied between the first electrode 79 and the second electrode 80, a current flows from the second electrode 80 toward the first electrode 79. The current sequentially flows through the second conductive type semiconductor layer 78, the light emitting layer 77, the first conductive type semiconductor layer 76 and the first electrode 79 in this order from the second electrode 80. When the current flows in this way, electrons are injected from the first conductive type semiconductor layer 76 into the light emitting layer 77 and holes are injected from the second conductive type semiconductor layer 78 into the light emitting layer 77. The electrons and the holes are recombined in the light emitting layer 77 to emit light.

The light from the light emitting layer 77 is emitted from a front surface 78A of the second conductive type semiconductor layer 78. On the other hand, light propagating from the light emitting layer 77 toward the first conductive type semiconductor layer 76 is also present. This light sequentially transmits through the first conductive type semiconductor layer 76, the substrate 75 and the ITO layer 6 in this order and is reflected at an interface between the ITO layer 6 and the reflective layer 7 and an interface between the first layer 71 and the second layer 72 in the reflective layer 7. The reflected light sequentially transmits through the ITO layer 6 and the substrate 75 in this order and is extracted from the front surface 78A of the second conductive type semiconductor layer 78.

The light emitting element 74 can have the similar operation and effects as the above-described light emitting element 1. In order to prepare the light emitting element 74, first, the first conductive type semiconductor layer 76 is formed on the front surface 75A of the substrate 75 and the light emitting layer 77 and the second conductive type semiconductor layer 78 are sequentially formed in this order on the entire front surface 76B of the first conductive type semiconductor layer 76. Next, the first conductive type semiconductor layer 76, the light emitting layer 77 and the second conductive type semiconductor layer 78 are patterned by etching or lift-off to expose the first region 76C of the front surface 76B of the first conductive type semiconductor layer 76. Next, the first electrode 79 is formed in the first region 76C and the second electrode 80 is formed on the second conductive type semiconductor layer 78. Thereafter, the ITO layer 6 and the first and second layers 71 and 72 of the reflective layer 7 are sequentially formed in this order on the rear surface 75B of the substrate 75. Then, one wafer serving as an original substrate for the substrate 75 is diced using a laser scriber or the like, which results in individual light emitting elements 74.

Then, the light emitting element 74 is bonded to the major surface 51A of the above-described sub-mount substrate 51 via a bonding layer 85 made of a paste such as Ag, solder or the like. The above-described pair of leads 63 is mounted at a position avoiding the bonding layer 85 on the major surface 51A of the sub-mount substrate 51 shown in FIG. 14. The first electrode 79 and the second electrode 80 of the light emitting element 74 are electrically connected to their respective closest leads 63 via their respective bonding wires 65. The light emitting element 74 and the sub-mount substrate 51 constitute the light emitting element unit 64 (light emitting device 60). Similar to the light emitting element 1, it is to be understood that the light emitting element package 70 (see FIG. 13) may be constituted by the light emitting element 74 and the package 91 covering the light emitting element 74 in such a manner to expose the front surface 75A of the substrate 75.

Figure 15:
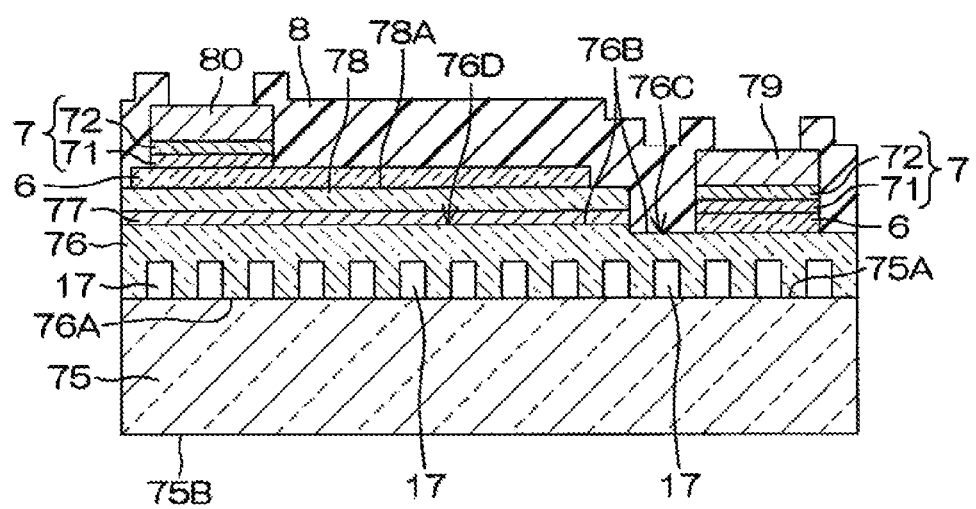
FIG. 15 is a schematic sectional view of a light emitting element according to still another embodiment of the present disclosure.

FIG. 15 shows a modification of the light emitting element 74. In this figure, the same elements as FIG. 14 are denoted by the same reference numerals and explanation thereof will not be repeated. The light emitting element 74 of FIG. 15 has substantially the same configuration as the light emitting element 74 of FIG. 14 except the arrangement of the ITO layer 6 and the reflective layer 7. In the light emitting element 74 shown in FIG. 15, the ITO layer 6 is stacked on the front surface 78A of the second conductive type semiconductor layer 78 and in the first region 76C of the front surface 76B of the first conductive type semiconductor layer 76. A portion of the ITO layer 6 formed on the first conductive type semiconductor layer 76 side is not connected to but separated and electrically isolated from the other potion of the ITO layer 6 formed on the second conductive type semiconductor layer 78 side. The first electrode 79 is stacked on the ITO layer 6 in the first conductive type semiconductor layer 76 side via the reflective layer 7. The second electrode 80 is stacked on the ITO layer 6 in the second conductive type semiconductor layer 78 side via the reflective layer 7. In this case, similar to the embodiments described above (see FIGS. 2 and 14), the ITO layer 6 is arranged to face the substrate 75 and the reflective layer 7 is stacked on the ITO layer 6 in the opposite side to the substrate 75. The reflective layer 7 on the ITO layer 6 includes the above-described first layer 71 and second layer 72. The first layer 71 is stacked on the ITO layer 6 in contact with the ITO layer 6 and the second layer 72 is stacked on the first layer 71 in the opposite side to the ITO layer 6. Accordingly, only the first layer 71 is present between the second layer 72 and the ITO layer 6. The first layer 71 and the second layer 72 have the same dimension (thickness) and material similar to the embodiments described above (see FIGS. 2 and 14).

In the light emitting element 74 shown in FIG. 15, light from the light emitting layer 77 is emitted from the ITO layer 6 on the second conductive type semiconductor layer 78. At this time, light propagating from the light emitting layer 77 toward the first electrode 79 and the second electrode 89 is present. However, this light is released after being reflected by the reflective layer 7, thereby preventing this light from being absorbed in the first electrode 79 or the second electrode 80. This light emitting element 74 can have the similar operation and effects as the above-described light emitting elements 1 and 74 (see FIGS. 2 and 14). In particular, it is possible to increase light extraction efficiency of the light emitting element 74 by increasing a light reflectance in the first electrode 79 and the second electrode 80. In addition, the above-described insulating layer 8 may cover the front surface 76B of the first conductive type semiconductor layer 76, the front surface 78A of the second conductive type semiconductor layer 78, the ITO layer 6 and the reflective layer 7 in such a manner to expose only the front surfaces of the first electrode 79 and the second electrode 80.

It is also possible to provide a light emitting element 74 having a configuration where the ITO layer 6 and the reflective layer 7 are disposed not only on the first electrode 79 and the second electrode 80 but also on the rear surface 75B of the substrate 75 (a combination of the configurations of FIGS. 14 and 15). In addition, while FIG. 15 shows the light emitting element 74 of a two-wire type, a flip type where a front surface except electrodes (portions corresponding to the first electrode 79 and the second electrode 80) is covered by an insulating layer may be considered, for example as shown in FIG. 2.

In addition to the above embodiments, the present disclosure may provide many other embodiments. For example, although it has been illustrated in the above embodiments that the first conductive type is an n-type and the second conductive type is a p-type, a light emitting element having the first conductive type as a p-type and the second conductive type as an n-type may be formed. That is, a structure obtained by inverting a conductive type between a p-type and an n-type in the above embodiments corresponds to one of embodiments of the present disclosure. In addition, although it has been illustrated in the above embodiments that GaN is used as a nitride semiconductor constituting the first conductive type semiconductor layer and the second conductive semiconductor layer in the above embodiments, other nitride semiconductors such as aluminum nitride (AlN), indium nitride (InN) and the like may be used. Nitride semiconductors may have the general chemical formula of $Al_xIn_yGa_{1-x-y}N$ ($0 \leq x \leq 1$, $0 \leq y \leq 1$, $0 \leq x+y \leq 1$). In addition, the present disclosure may he applied to other compound semiconductors such as GaAs and the like and semiconductor materials (for example, diamond) other than the compound semiconductors, without being limited to the nitride semiconductors.

Figure 16:
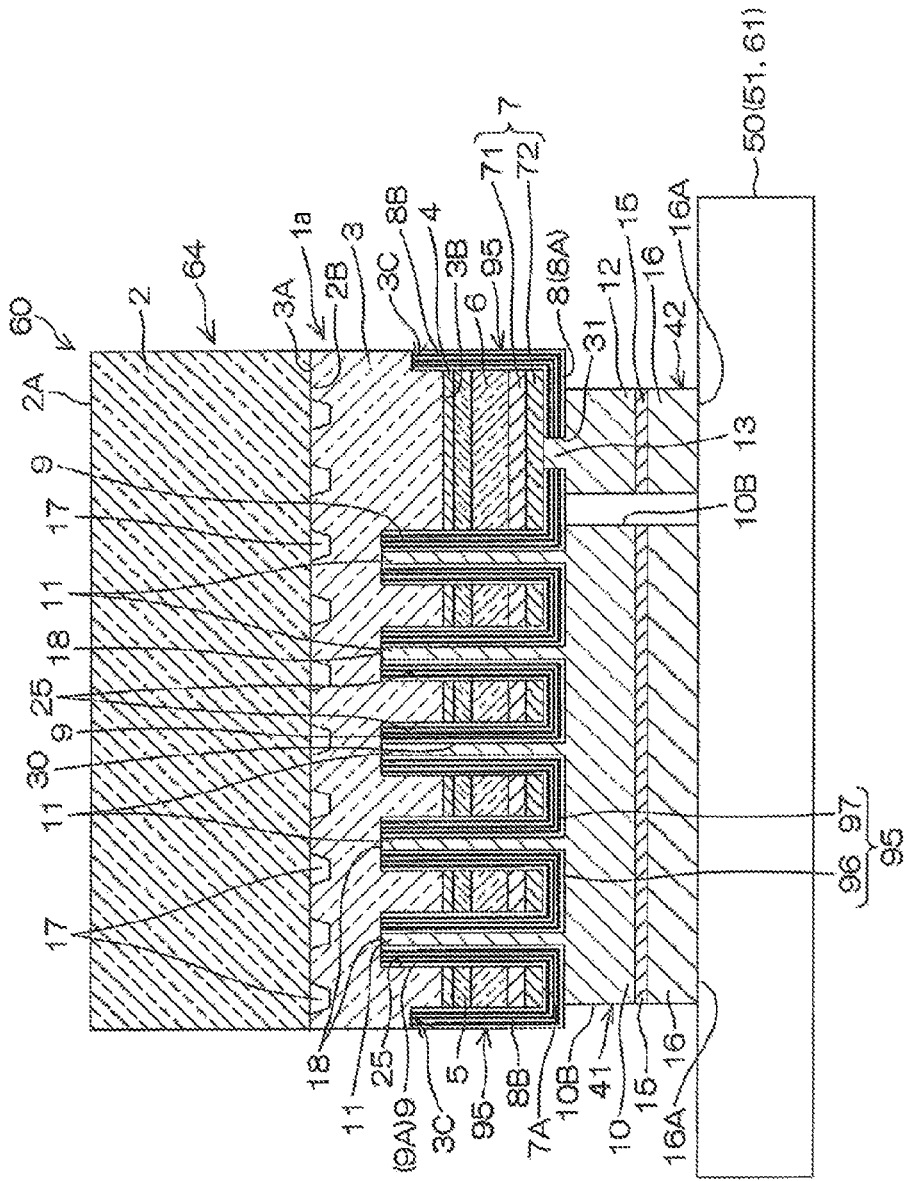
FIG. 16 is a schematic sectional view of a light emitting element according to another embodiment of the present disclosure where a multi-layered reflecting mirror is applied to an insulating layer.

In addition, a multi-layered reflecting mirror 95 to be described below may be employed for the above-described insulating layer 8. That is, the insulating layer 8 may include the multi-layered reflecting mirror 95. FIG. 16 is a schematic sectional view of a light emitting element 1a according to another embodiment where the multi-layered reflecting mirror 95 is applied to the insulating layer 8. The light emitting element 1a shown in FIG. 16 has substantially the same configuration as the light emitting element 1 shown in FIG. 12A except that the multi-layered reflecting mirror 95 is applied to the insulating layer 8. Therefore, portions in FIG. 16 corresponding to those described in FIG. 12A are denoted by the same reference numerals and explanation of which will not be repeated. In addition, FIG. 16 shows the sub-mount 50 (the sub-mount substrate 51) to which the light emitting element 1a is connected in a flip-chip type, the supporting substrate 61 and so on, which is a simpler version than FIG. 12A (this is true of FIG. 18 to be described later).

The multi-layered reflecting mirror 95 is a so-called Distributed Bragg Reflector (DBR). The insulating layer 8 is an insulating DBR reflective layer to which the multi-layered reflecting mirror 95 is applied. The multi-layered reflecting mirror 95 is formed by alternately stacking two or more kinds of films having different refractive indexes (specifically, films transparent to emission wavelength). As used herein, the phrase "alternately stacking" refers to stacking different kinds of films in such a manner that the same kinds of films do not overlap with each other. Examples of films used for the multi-layered reflecting mirror 95 may include $SiO_2$, SiN, SiON, $TiO_2$, $Al_2O_3$, $Nb_2O^5$, $ZrO^2$, MN and the like. The following description is given to the multi-layered reflecting mirror 95 including two kinds of films, i.e., $SiO_2$ and SiN.

The multi-layered reflecting mirror 95 of this embodiment is formed by alternately stacking a plurality of pairs (for example, 15 pairs) of $SiO_2$ films 96 and SiN films 97. In FIG. 16, for convenience of description, the $SiO_2$ films 96 are shown in a white strip shape and the SiN films 97 are shown in a black strip shape. FIG. 16 shows the multi-layered reflecting mirror 95 schematically and, therefore, the number of $SiO_2$ films 96 and SiN films 97 may be unrealistic. This is true of FIG. 18 to be described later.

The $SiO_2$ films 96 and the SiN films 97 are alternately stacked in the thickness direction of the substrate 2 such that these films are in parallel to the front surface 7A of the reflective layer 7 in a region corresponding to the above-mentioned cover portion 8A. However, the SiO$_2$ films 96 and the SiN films 97 are alternately stacked in a direction perpendicular to the thickness direction of the substrate 2 such that these films are in parallel to the inner peripheral surface of the trench 25 extending in the thickness direction of the substrate 2 and the outer end surfaces of the light emitting layer 4, the second conductive type semiconductor layer 5, the ITO layer 6 and the reflective layer 7 in a region corresponding to the above-mentioned extension portion 8B and insulating tube layer 9. In addition, for convenience of description, the inner peripheral surface of the trench 25 extending in the thickness direction of the substrate 2 does not have the above-mentioned stepped portions 5A and 6A (see FIG. 12A) and is flat in the thickness direction of the substrate 2. In addition, the outer end surfaces of the light emitting layer 4, the second conductive type semiconductor layer 5, the ITO layer 6 and the reflective layer 7 are flush with each other in the thickness direction of the substrate 2.

In the multi-layered reflecting mirror 95, optical path length (=refractive index of SiO$_2$ or SiN×thickness T of each film) of each of the SiO$_2$ films 96 and the SiN films 97 is equal to ¼ of a wavelength of light to be reflected by the multi-layered reflecting mirror 95. Accordingly, in the multi-layered reflecting mirror 95, the thickness T of each of the SiO$_2$ films 96 and the SiN films 97 can be calculated by dividing ¼ of the wavelength of light to be reflected by the multi-layered reflecting mirror 95 by the refractive index of SiO$_2$ (1.46) or SiN (1.9). If the wavelength of light to be reflected by the multi-layered reflecting mirror 95 is 450 nm, the thickness T of one SiO$_2$ film 96 is about 77 nm (=450/(4×1.46) and the thickness T of one SiN film 97 is about 59 nm (=450/(4×1.9).

However, the thickness T of each film may not be strictly calculated according to the above equation using the refractive index and the wavelength, and the multi-layered reflecting mirror 95 may be formed by stacking different kinds of films having irregular thicknesses T. The multi-layered reflecting mirror 95 configured as above is formed by forming the trench 25 and the stepped portion 3C of the first conductive type semiconductor layer 3, removing the resist pattern 22, and alternately stacking the pairs of SiO$_2$ films 96 and SiN films 97 on the reflective layer 7, as shown in FIG. 9D. Then, as shown in FIG. 9E, instead of the above-mentioned SiN layer 26, the multi-layered reflecting mirror 95 fills the inner space of the trench 25 and entirely covers the outer peripheral surfaces of the light emitting layer 4, the second conductive type semiconductor layer 5, the ITO layer 6 and the reflective layer 7 and the stepped portion 3C of the first conductive type semiconductor layer 3. The light emitting element 1a in which the multi-layered reflecting mirror 95 is applied to the insulating layer 8 has the same manufacturing process as the typical light emitting element 1 (see FIGS. 2 and 12A) in which the multi-layered reflecting mirror 95 is not applied to the insulating layer 8, except the process of manufacturing the multi-layered reflecting mirror 95.

Figure 17:
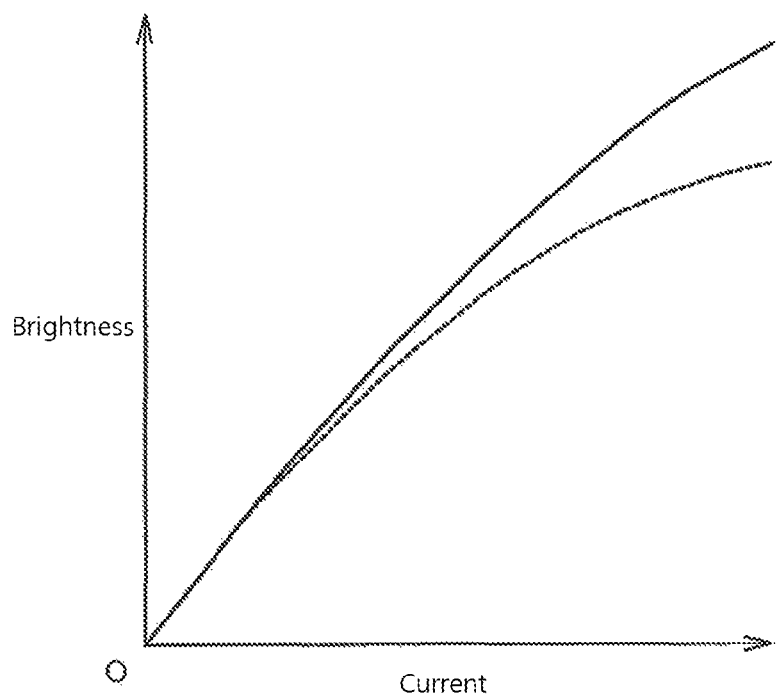
FIG. 17 is a graph showing a relationship between current and brightness in a case where the multi-layered reflecting mirror is applied to the insulating layer and a case where no multi-layered reflecting mirror is applied to the insulating layer.

The performance of the typical light emitting element 1 shown in FIG. 12A was compared with the performance of the light emitting element 1a shown in FIG. 16. FIG. 17 is a graph showing a relationship between current and brightness in the light emitting element 1 and the light emitting element 1a, in which a characteristic curve for the light emitting element 1 is indicated by a dotted line and a characteristics curve for the light emitting element 1a is indicated by a solid line. In the light emitting element 1 shown in FIG. 12A, some of light propagating into the insulating tube layer 9 without being reflected by the reflective layer 7 transmits through the insulating tube layer 9 and the insulating layer 8 made of the same insulating material (SiO$_2$ or the like). Most of the light is reflected by the first and second external connections 10 and 12. However, some of the light may be leaked toward the sub-mount 50 (the package side) from a region of the light emitting element 1 which does not overlap with the reflective layer 7 and the first and second external connections 10 and 12 when viewed from the top. On the other hand, since the light emitting element 1a shown in FIG. 16 is covered by the insulating layer 8 to which the multi-layered reflecting mirror 95 is applied, light not reflected by the reflective layer 7 is reflected by the multi-layered reflecting mirror 95 previous to the first and second external connections 10 and 12 toward the substrate 2 side and is extracted from the front surface 2A (the light extraction surface) of the substrate 2. Accordingly, since the light emitting element 1a includes the multi-layered reflecting mirror 95 to prevent light reaching the ITO layer 6 and the reflective layer 7 from being leaked toward the opposite side to the front surface 2A of the substrate 2, thereby allowing light not reflected by the reflective layer 7 to be reflected with a high reflectance of 99%, which can result in improvement of brightness over the light emitting element 1, as shown in FIG. 17.

Figure 18:
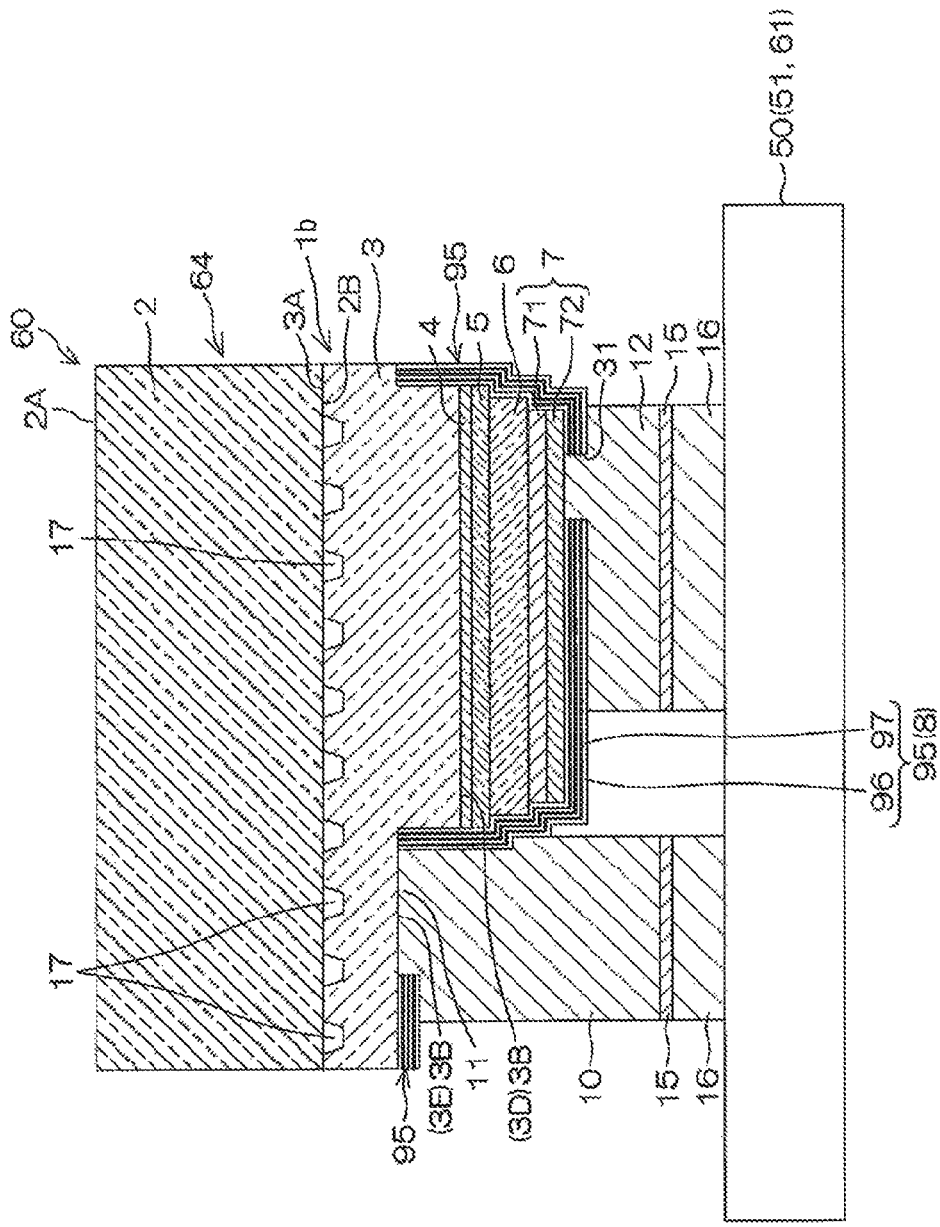
FIG. 18 is a schematic sectional view of a light emitting element according to still another embodiment of the present disclosure where a multi-layered reflecting mirror is applied to an insulating layer.

In addition to the configuration where a plurality of first contacts 11 is discretely arranged in three dimensions, as shown in FIG. 16 (also see FIG. 1), the multi-layered reflecting mirror 95 may be applied to the insulating layer 8 in a simpler configuration as shown in FIG. 18. In a light emitting element 1b (simplified version) shown in FIG. 18, the light emitting layer 4, the second conductive type semiconductor layer 5, the ITO layer 6 and the reflective layer 7 are partially stacked in one longitudinal region 3D in the rear surface 3B of the first conductive type semiconductor layer 3, while the other longitudinal region 3E is exposed to the front surface 3A, with this region 3E more recessed by one step than the one longitudinal region 3D. The first contact 11 is connected to the other region 3E.

The multi-layered reflecting mirror 95 of the insulating layer 8 electrically isolates the first contact 11 and the first external connection 10 from the light emitting layer 4, the second conductive type semiconductor layer 5, the ITO layer 6 and the reflective layer 7. In addition, in a region of the light emitting element 1b in the sub-mount 50 side, the multi-layered reflecting mirror 95 covers at least a region which does not overlap with the reflective layer 7 and the first and second external connections 10 and 12 when viewed from the top. Accordingly, the light emitting element 1b having the above simpler configuration can achieve improved brightness.

Although it has been illustrated in the above embodiment that the insulating layer 8 is constituted by one kind of multi-layered reflecting mirror 95, the insulating layer 8 may be constituted by combining and stacking different kinds of multi-layered reflecting mirrors 95, in which case the above-described kind and thickness T of films constituting the multi-layered reflecting mirrors 95 may be different for different multi-layered reflecting mirrors 95.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A light emitting element comprising:
a substrate;
a first conductive type semiconductor layer stacked on the substrate;
a light emitting layer stacked on the first conductive type semiconductor layer;
a second conductive type semiconductor layer stacked on the light emitting layer;
an ITO (Indium Tin Oxide) layer stacked on the second conductive type semiconductor layer;
a reflective layer stacked on the ITO layer;
an insulating layer having a cover insulating portion and an extension insulating portion; and
a contact embedded in the insulating layer, and having a bottom portion thereof in contact with the first conductive type semiconductor layer, the cover insulating portion of the insulating layer reaching the bottom portion of the contact,
wherein the substrate is transparent to an emission wavelength of the light emitting layer,
wherein the reflective layer includes
a Ti-containing first layer stacked on the ITO layer to make contact with the ITO layer, and
an Al-containing second layer stacked on the Ti-containing first layer and being in contact with the Ti-containing first layer in an opposite side to the ITO layer without contacting the ITO layer,
wherein a thickness of the Ti-containing first layer is smaller than a thickness of the Al-containing second layer and a thickness of the ITO layer,
wherein the extension insulating portion covers outer end surfaces of the Ti-containing first layer, of the Al-containing second layer and of the ITO layer,
wherein the extension insulating portion reaches the first conductive semiconductor layer at an outer side surface of the light emitting element, where the extension insulating portion and the first conductive semiconductor layer form the outer side surface of the light emitting element, and
wherein a depth of the cover insulating portion reaching the bottom portion of the contact is larger than a depth of the extension insulating portion reaching the first conductive semiconductor layer.

2. The light emitting element of claim 1, wherein the Ti-containing first layer has a thickness of equal to or more than 1 nm and equal to or less than 10 nm.

3. The light emitting element of claim 2, wherein the Ti-containing first layer has a thickness of equal to or less than 5 nm.

4. The light emitting element of claim 2, wherein the Ti-containing first layer has a thickness of equal to or less than 2 nm.

5. The light emitting element of claim 2, wherein the Ti-containing first layer has a thickness of equal to or more than 1 nm.

6. The light emitting element of claim 1, wherein the Ti-containing first layer is made of TiN.

7. The light emitting element of claim 1, wherein only the Ti-containing first layer is present between the Al-containing second layer and the ITO layer.

8. The light emitting element of claim 1, wherein the substrate is made of sapphire.

9. A light emitting element package comprising:
the light emitting element of claim 1; and
a package covering the light emitting element to expose a light extraction surface of the substrate.

10. A light emitting element comprising:
a substrate;
a first conductive type semiconductor layer stacked on the substrate;
a light emitting layer stacked on the first conductive type semiconductor layer;
a second conductive type semiconductor layer stacked on the light emitting layer;
an ITO (Indium Tin Oxide) layer stacked on the substrate in the opposite side to the first conductive type semiconductor layer;
a reflective layer stacked on the ITO layer in the opposite side to the substrate;
an insulating layer having a cover insulating portion and an extension insulating portion; and
a contact embedded in the insulating layer, and having a bottom portion thereof in contact with the first conductive type semiconductor layer, the cover insulating portion of the insulating layer reaching the bottom portion of the contact,
wherein the substrate is transparent to an emission wavelength of the light emitting layer,
wherein the reflective layer includes
a Ti-containing first layer stacked on the ITO layer to make contact with the ITO layer, and
an Al-containing second layer stacked on the Ti-containing first layer and being in contact with the Ti-containing first layer in an opposite side to the ITO layer without contacting the ITO layer,
wherein a thickness of the Ti-containing first layer is smaller than a thickness of the Al-containing second layer and a thickness of the ITO layer,
wherein the extension insulating portion covers outer end surfaces of the Ti-containing first layer, of the Al-containing second layer and of the ITO layer,
wherein the extension insulating portion reaches the first conductive semiconductor layer at an outer side surface of the light emitting element, where the extension insulating portion and the first conductive semiconductor layer form the outer side surface of the light emitting element, and
wherein a depth of the cover insulating portion reaching the bottom portion of the contact is larger than a depth of the extension insulating portion reaching the first conductive semiconductor layer.

11. The light emitting element of claim 10, wherein the Ti-containing first layer has a thickness of equal to or more than 1 nm and equal to or less than 10 nm.

12. The light emitting element of claim 11, wherein the Ti-containing first layer has a thickness of equal to or less than 5 nm.

13. The light emitting element of claim 11, wherein the Ti-containing first layer has a thickness of equal to or less than 2 nm.

14. The light emitting element of claim 11, wherein the Ti-containing first layer has a thickness of equal to or more than 1 nm.

15. The light emitting element of claim 10, wherein the Ti-containing first layer is made of TiN.

16. The light emitting element of claim 10, wherein only the Ti-containing first layer is present between the Al-containing second layer and the ITO layer.

17. The light emitting element of claim 10, wherein the substrate is made of sapphire.

18. A light emitting element package comprising:
the light emitting element of claim 10; and
a package covering the light emitting element to expose a light extraction surface of the substrate.

19. The light emitting element of claim 1, wherein the insulating layer covers the reflective layer, and electrically isolates the first conductive type semiconductor layer from the second conductive type semiconductor layer.

20. The light emitting element of claim 19, wherein the insulating layer includes a multi-layered reflecting mirror that has two or more kinds of films having different refractive indexes.

21. The light emitting element of claim 10, wherein the insulating layer covers the reflective layer, and electrically isolates the first conductive type semiconductor layer from the second conductive type semiconductor layer.

22. The light emitting element of claim 21, wherein the insulating layer includes a multi-layered reflecting mirror that has two or more kinds of films having different refractive indexes.

23. The light emitting element of claim 1, wherein the cover insulating portion covers an entire upper surface of the Al-containing second layer.

24. The light emitting element of claim 10, wherein the cover insulating portion covers an entire upper surface of the Al-containing second layer.

* * * * *